(12) United States Patent
Nagao

(10) Patent No.: US 11,242,961 B2
(45) Date of Patent: Feb. 8, 2022

(54) METHOD OF MANUFACTURING LIGHT-EMITTING DEVICE

(71) Applicant: NICHIA CORPORATION, Anan (JP)

(72) Inventor: Masaki Nagao, Anan (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 17/240,322

(22) Filed: Apr. 26, 2021

(65) Prior Publication Data
US 2021/0332955 A1    Oct. 28, 2021

(30) Foreign Application Priority Data

Apr. 28, 2020 (JP) .............................. JP2020-079713

(51) Int. Cl.
| | | |
|---|---|---|
| F21K 9/90 | (2016.01) | |
| F21K 9/68 | (2016.01) | |
| F21K 9/62 | (2016.01) | |
| F21Y 115/10 | (2016.01) | |

(52) U.S. Cl.
CPC ................. *F21K 9/90* (2013.01); *F21K 9/62* (2016.08); *F21K 9/68* (2016.08); *F21Y 2115/10* (2016.08)

(58) Field of Classification Search
CPC .................................................. F21Y 2115/10
See application file for complete search history.

(56) References Cited

U.S. PATENT DOCUMENTS

| | | | | |
|---|---|---|---|---|
| 10,910,537 | B2 * | 2/2021 | Marutani | ................ H01L 33/62 |
| 2013/0328090 | A1 * | 12/2013 | Park | ...................... F21S 41/192 |
| | | | | 257/98 |
| 2013/0335975 | A1 * | 12/2013 | Park | ...................... G02B 6/0055 |
| | | | | 362/297 |
| 2015/0316215 | A1 * | 11/2015 | Togawa | ................ H01L 33/505 |
| | | | | 362/231 |
| 2017/0248280 | A1 * | 8/2017 | Ichikawa | .................. F21K 9/62 |
| 2019/0165218 | A1 | 5/2019 | Nakai et al. | |
| 2019/0302350 | A1 | 10/2019 | Yamaoka et al. | |
| 2020/0096163 | A1 * | 3/2020 | Yamaoka | ............... F21S 41/192 |
| 2020/0328328 | A1 | 10/2020 | Nakai et al. | |

FOREIGN PATENT DOCUMENTS

| | | |
|---|---|---|
| JP | 2002-033519 A | 1/2002 |
| JP | 2014-127679 A | 7/2014 |
| JP | 2017-215352 A | 12/2017 |
| JP | 2019-102614 A | 6/2019 |
| JP | 2019-186513 A | 10/2019 |
| JP | 2020-053504 A | 4/2020 |

* cited by examiner

*Primary Examiner* — Kevin Quarterman
(74) *Attorney, Agent, or Firm* — Foley & Lardner LLP

(57) ABSTRACT

A method of manufacturing a light-emitting device includes: placing a light-emitting element; providing a light-shielding frame; supplying a light-reflective resin; providing a light-transmissive member; forming an optical member; and bonding an upper surface of the light-emitting element and a surface of the light-transmissive member with each other.

11 Claims, 18 Drawing Sheets

METHOD OF MANUFACTURING LIGHT-EMITTING DEVICE

CROSS-REFERENCE TO RELATED APPLICATION

This application claims priority to Japanese Patent Application No. 2020-079713, filed on Apr. 28, 2020, the disclosure of which is hereby incorporated by reference as if set forth in its entirety.

BACKGROUND

The present disclosure relates to a method of manufacturing a light-emitting device.

High-output light-emitting devices including light-emitting elements such as LEDs are increasingly used as light sources for vehicles and the like in recent years. For example, Japanese Patent Publication No. 2014-127679 discloses a high-output light-emitting device used as a light source for a vehicle. In the high-output light-emitting device, a heat dissipation layer is formed to cover the periphery of the light-emitting surface of a light-emitting element to increase the heat dissipation effect.

SUMMARY

An object of certain embodiments of the present disclosure is to provide a method capable of simply manufacturing a light-emitting device in which a difference in luminance between the inside and the outside of the light exit surface is large, and light emitted from a light-emitting element is efficiently extracted.

According to an embodiment of the present disclosure, a method of manufacturing a light-emitting device includes: placing a light-emitting element on a board; providing a light-shielding frame including a first main surface and a second main surface opposite to the first main surface, the light-shielding frame defining a through hole penetrating from the first main surface to the second main surface, the second main surface having a flat portion and a recessed portion (i.e., a recess) that is continuous with the through hole; supplying a light-reflective resin on at least the flat portion of the second main surface of the light-shielding frame; providing a light-transmissive member having a first surface having an outer perimeter that is smaller than an inner perimeter of the through hole, a second surface opposite to the first surface, a first lateral surface that is continuous with the first surface, a second lateral surface that is located outside of the first lateral surface and is continuous with the second surface, and a third surface that is continuous with the first and second lateral surfaces; forming an optical member, comprising disposing the light-reflective resin between the first lateral surface of the light-transmissive member and an inner lateral surface defining the through hole and within the recessed portion by bringing the third surface into contact with the light-reflective resin at a position where the first lateral surface of the light-transmissive member is spaced from the inner lateral surface defining the through hole, and thereafter, forming a first light-reflective member by curing the light-reflective resin to bond the light-shielding frame and the light-transmissive member with each other via the first light-reflective member; and bonding an upper surface of the light-emitting element and the second surface with each other.

According to certain embodiments of the present disclosure, it is possible to manufacture, in a simple manner, a light-emitting device in which a difference in luminance between the inside and the outside of the light exit surface is large, and light emitted from a light-emitting element is efficiently extracted.

DETAILED DESCRIPTION

Manufacturing methods according to embodiments of the present disclosure and light-emitting devices provided by the methods will be described below with reference to the accompanying drawings. The embodiments described below are intended to embody the technical concepts of the present invention, but the invention is not limited to the described embodiments. The drawings referred to in the description below schematically illustrate embodiments of the present disclosure. The scales, the distances, the positional relations, and the like of members may be exaggerated, or illustration of part of the members may be omitted. Some sectional views can be end views showing only the cut surfaces. As used herein, the terms "coating", "covering" and the like are not limited to a case of direct contact, but also encompasses a case of indirect contact such as an indirect coating (e.g., one via other component(s)), unless otherwise stated.

Light-Emitting Device

Figure 1:
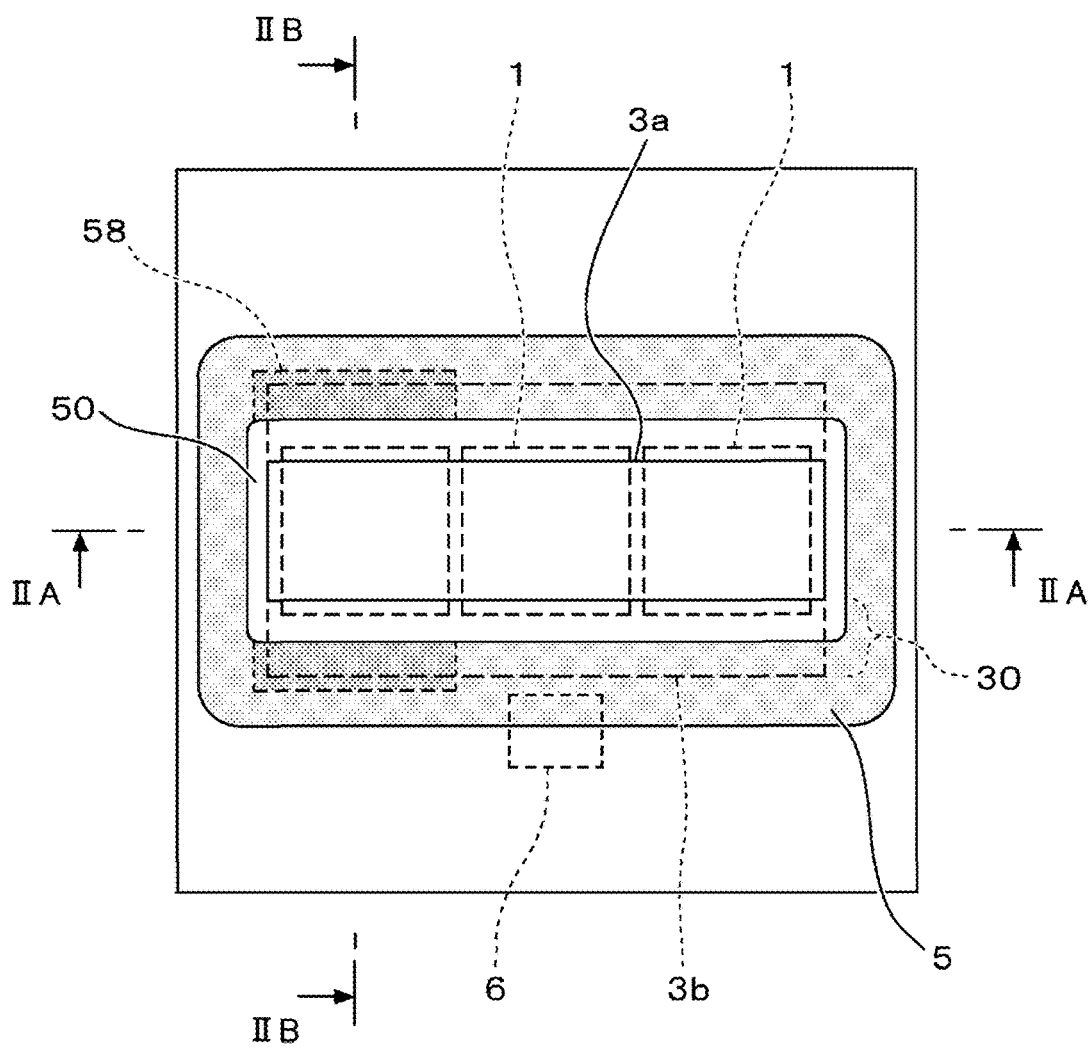
FIG. 1 is a schematic top view showing one example of a light-emitting device according to an embodiment.
Figure 2A:
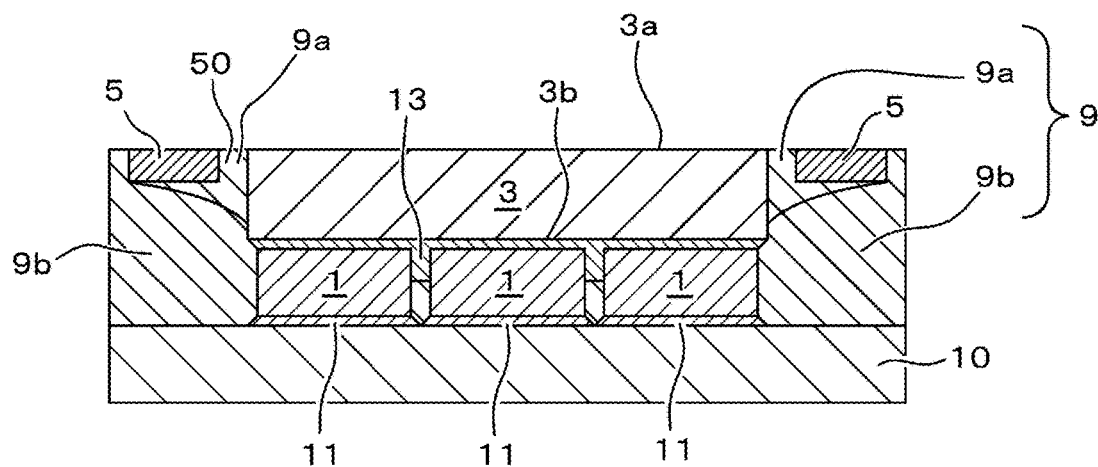
FIG. 2A is a schematic sectional view taken along the line IIA-IIA of FIG. 1.
Figure 2B:
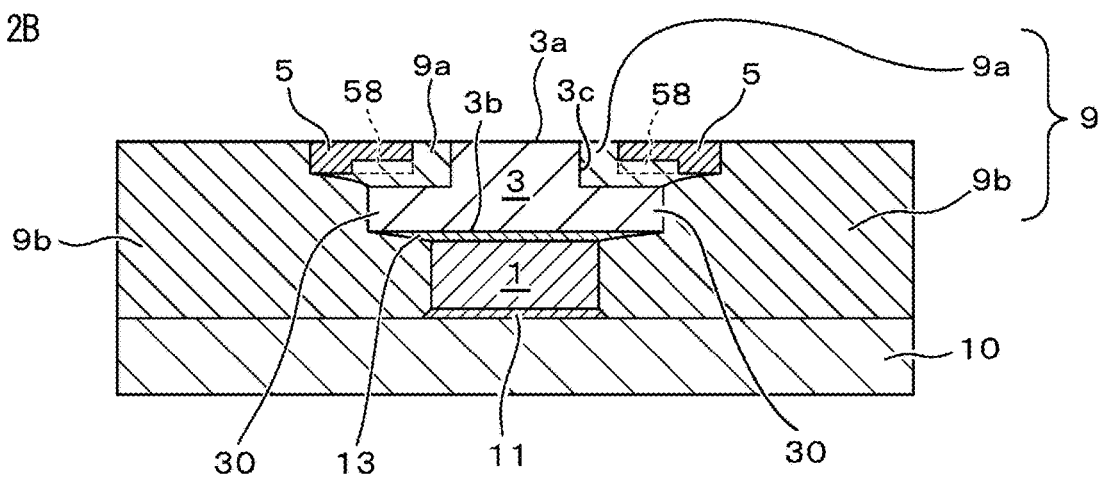
FIG. 2B is a schematic sectional view taken along the line IIB-IIB of FIG. 1.

The light-emitting device of the present embodiment at least includes a light-shielding frame, a light-transmissive member, and a light-emitting element. Specifically, as shown in FIG. 1 and FIGS. 2A and 2B, the light-emitting device includes a board 10, the light-emitting elements 1 placed on the board 10, a light-transmissive member 3 facing the upper surfaces of the light-emitting elements 1 serving as main light-emitting surfaces, a first light-reflective member 9a disposed over the lateral surfaces of the light-transmissive member 3, and the light-shielding frame 5 disposed in contact with the first light-reflective member 9a and surrounding the light-transmissive member 3.

Figure 3:
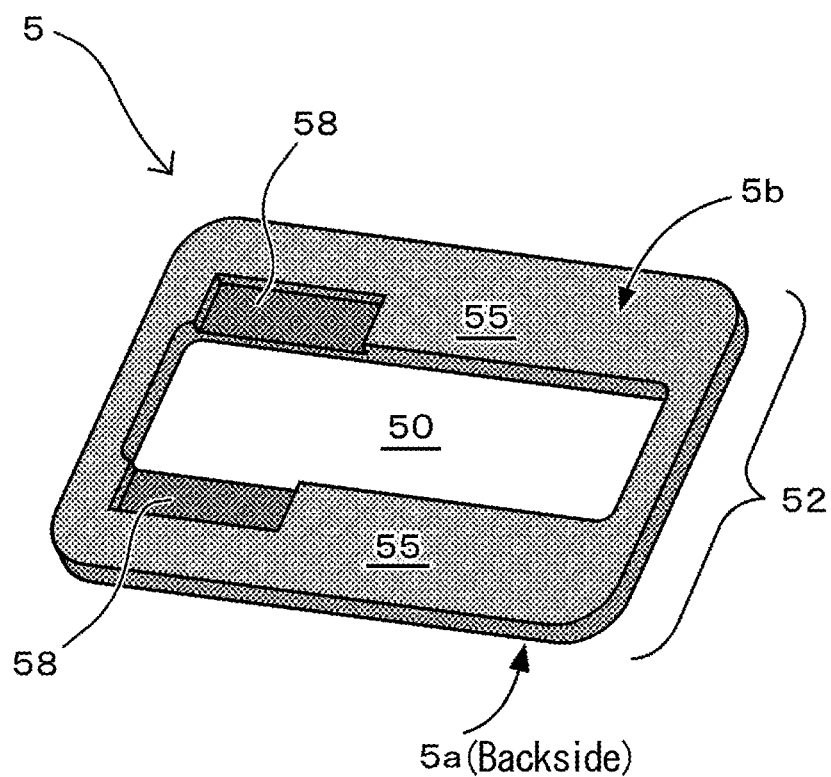
FIG. 3 is a schematic perspective view showing one example of a light-shielding frame of a light-emitting device according to an embodiment.

More specifically, the light-shielding frame 5 has a first main surface 5a and a second main surface 5b opposite to the first main surface 5a, as shown in FIG. 3. The light-shielding frame 5 defines a through hole 50 that penetrates from the first main surface 5a to the second main surface 5b. The second main surface 5b of the light-shielding frame 5 has a flat portion 55 and a recessed portion 58. The recessed portion 58 is continuous with the through hole 50. The first main surface 5a of the light-shielding frame 5 constitutes a part of the upper surface of the light-emitting device.

Figure 8A:
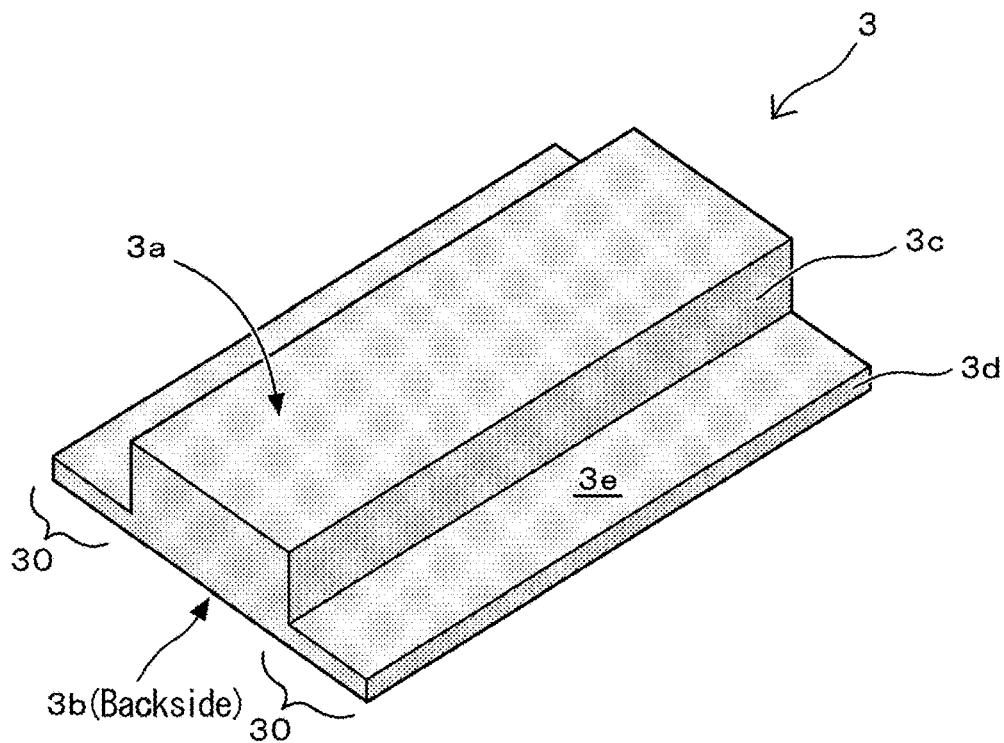
FIG. 8A is a schematic perspective view showing one example of a light-transmissive member of a light-emitting device according to an embodiment.
Figure 8B:
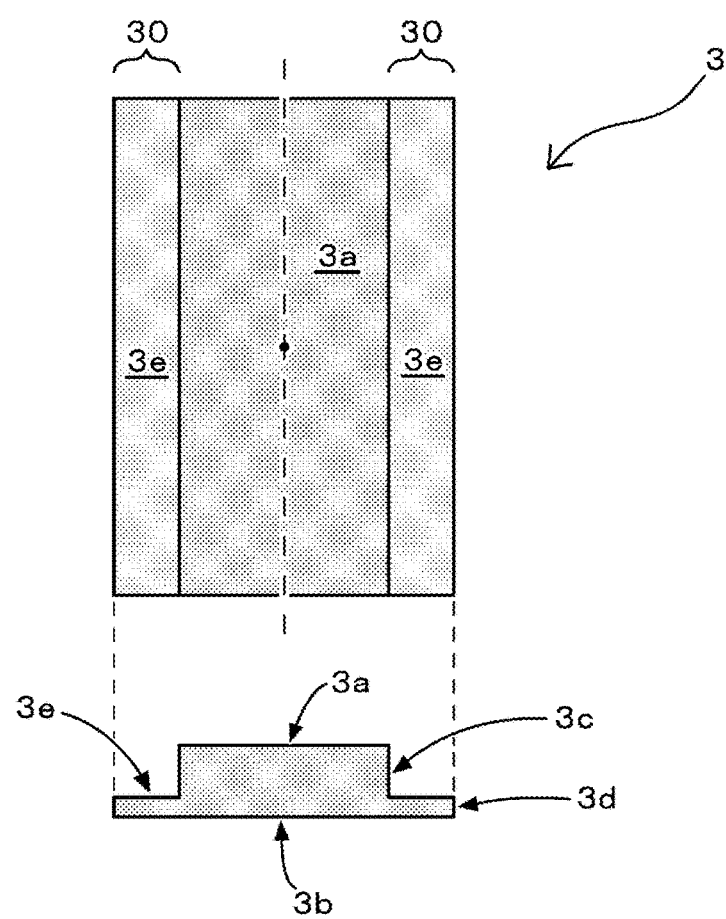
FIG. 8B is a top view and side view of one example of the light-transmissive member of the light-emitting device according to the embodiment.

The light-transmissive member 3 has a first surface 3a having an outer perimeter smaller than an inner perimeter of the through hole 50 of the light-shielding frame 5, a second surface 3b opposite to the first surface 3a, a first lateral surface 3c that is continuous with the first surface 3a, a second lateral surface 3d that is located outside of the first lateral surface 3c and is continuous with the second surface 3b, and a third surface 3e that is continuous with the first and second lateral surfaces 3c and 3d, as shown in FIGS. 8A and 8B. The first surface 3a of the light-transmissive member 3 constitutes a part of the upper surface of the light-emitting device. The second surface 5b of the light-transmissive member is bonded with the upper surface of the light-emitting elements 1.

The light-shielding frame 5 and the light-transmissive member 3 are bonded with each other by the first light-reflective member 9a to form an optical member 60. In the optical member 60, the light-transmissive member 3 and the light-shielding frame 5 are spaced from each other such that the first lateral surface 3c of the light-transmissive member 3 and the inner lateral surface defining the through hole 50 of the light-shielding frame 5 are bonded with each other via the first light-reflective member 9a.

Furthermore, the light-emitting device according to an embodiment of the present disclosure includes a second light-reflective member 9b between the first light-reflective member 9a and the board 10. The upper surface of the optical member 60 is exposed from the second light-reflective member 9b. The second light-reflective member 9b covers surfaces other than the upper surface of the optical member 60, the lateral surfaces of the light-emitting elements 1, and the upper surface of the board 10. Hereinafter, the first light-reflective member 9a and the second light-reflective member 9b may be collectively referred to as a "light-reflective member 9".

In the light-emitting device of the present embodiment, the light-transmissive member 3 is located in the through-hole 50 of the light-shielding frame 5. Specifically, as shown in FIGS. 2A and 2B, the light-transmissive member 3 is disposed such that the frame inner side of the light-shielding frame 5 (i.e., the inner lateral surface of the light-shielding frame defining the through-hole 50) and the first lateral surface 3c of the light-transmissive member 3 are bonded with each other via the first light-reflective member 9a. Furthermore, as shown in FIG. 1, the first surface 3a of the light-transmissive member 3 is exposed from the first light-reflective member 9a and the light-shielding frame 5 in a top view from above (i.e., when viewed from the light exit surface side of the light-emitting device). It is preferred that the first surface 3a of the light-transmissive member 3 is positioned in substantially the same plane as the upper surface of the light-shielding frame 5. That is, the first surface 3a of the light-transmissive member 3 and the upper surface of the light-shielding frame 5 are preferably in the same plane as each other.

In the light-emitting device of the present embodiment, in a top view (i.e., when viewed from the light exit surface of the light-emitting device), the inner perimeter of the through hole 50 of the light-shielding frame 5 is located apart from the outer perimeter of the first surface 3a of the light-transmissive member 3, and the first light-reflective member 9a is located between the inner perimeter of the through hole 50 of the light-shielding frame 5 and the outer perimeter of the first surface 3a of the light-transmissive member 3. In other words, the first main surface 5a of the light-shielding frame 5 and the first surface 3a of the light-transmissive member 3 are separated from each other with the first light-reflective member 9a interposed therebetween. Thus, the light-emitting device is configured such that the light-transmissive member 3 and the light-shielding frame 5 can be spaced from each other by interposing the first light-reflective member 9a between the light-transmissive member 3 and the light-shielding frame 5.

With the light-emitting device according to an embodiment of the present disclosure, a difference in luminance between the light exit surface and the region surrounding the light exit surface can be large, and light emitted from the light-emitting elements can be efficiently extracted.

In the light-emitting device according to the present embodiment, the distance between the inner perimeter of the through hole 50 and the outer perimeter of the first surface 3a of the light-transmissive member 3 can be 5 μm or more and 150 μm or less, for example, 40 μm or more and 60 μm or less, in order to achieve both the increase in the difference in luminance between the inside and the outside of the first surface 3a serving as the light exit surface, and the efficient extraction of light emitted from the light-emitting elements.

In the light-emitting device according to the present embodiment, the second main surface 5b of the light-shielding frame has a flat portion and a recessed portion, and the recessed portion is continuous with the through hole. Specifically, the light-shielding frame 5 has the through hole 50, and a frame part 52 defining the hole. In the frame part 52, the light-shielding frame 5 has the first main surface 5a and the second main surface opposite to the first main surface 5a. The second main surface 5b of the light-shielding frame has the flat portion, and the recessed portion whose bottom surface is positioned as if the recess extends as a whole toward the first main surface 5a from the surface level of the flat portion. The bottom surface of the recessed portion is in connection with the through hole.

Figure 4:
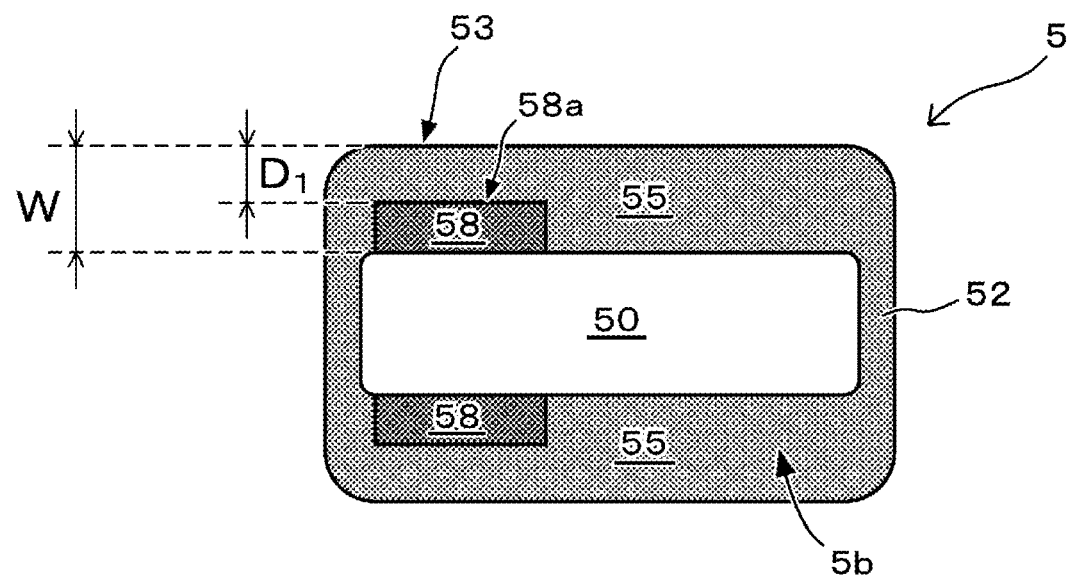
FIG. 4 is a schematic top view showing one example of the light-shielding frame of the light-emitting device according to the embodiment.

FIGS. 3 and 4 show an example of the light-shielding frame 5 used in the present embodiment. The light-shielding frame 5 is disposed in order to reduce the luminance of the portion of the upper surface of the light-emitting device other than the light exit surface. The light-transmissive member 3 is positioned in the through hole 50. The second main surface 5b of the light-shielding frame 5 is regarded as a region in which a light-reflective resin is supplied in the manufacture of the light-emitting device, and contributes to formation of the first light-reflective member 9a.

In an optical member formation step, the light-shielding frame 5 provided with the flat portion 55 and the recessed portion 58 that is continuous with the through hole 50 is used, and thereby the optical member is produced while inhibiting a generation of voids in a region of the first light-reflective member 9a between the light-transmissive member 3 and the light-shielding frame 5. Thus, the light extraction efficiency provided by the first light-reflective member interposed between the light-transmissive member and the light-shielding frame can be more improved. Also, a bonding strength between components of the light-emitting device can be increased.

Figure 5:
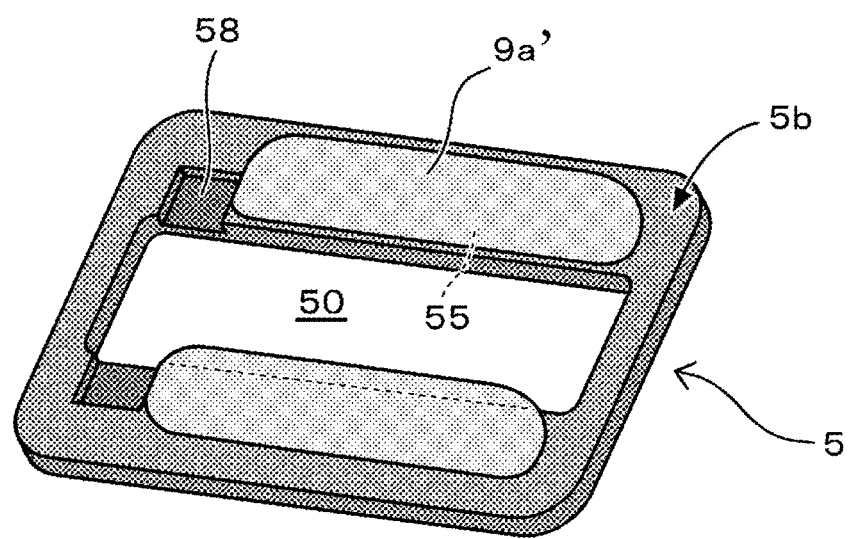
FIG. 5 is a schematic perspective view showing one example of a manufacturing method according to an embodiment.
Figure 6:
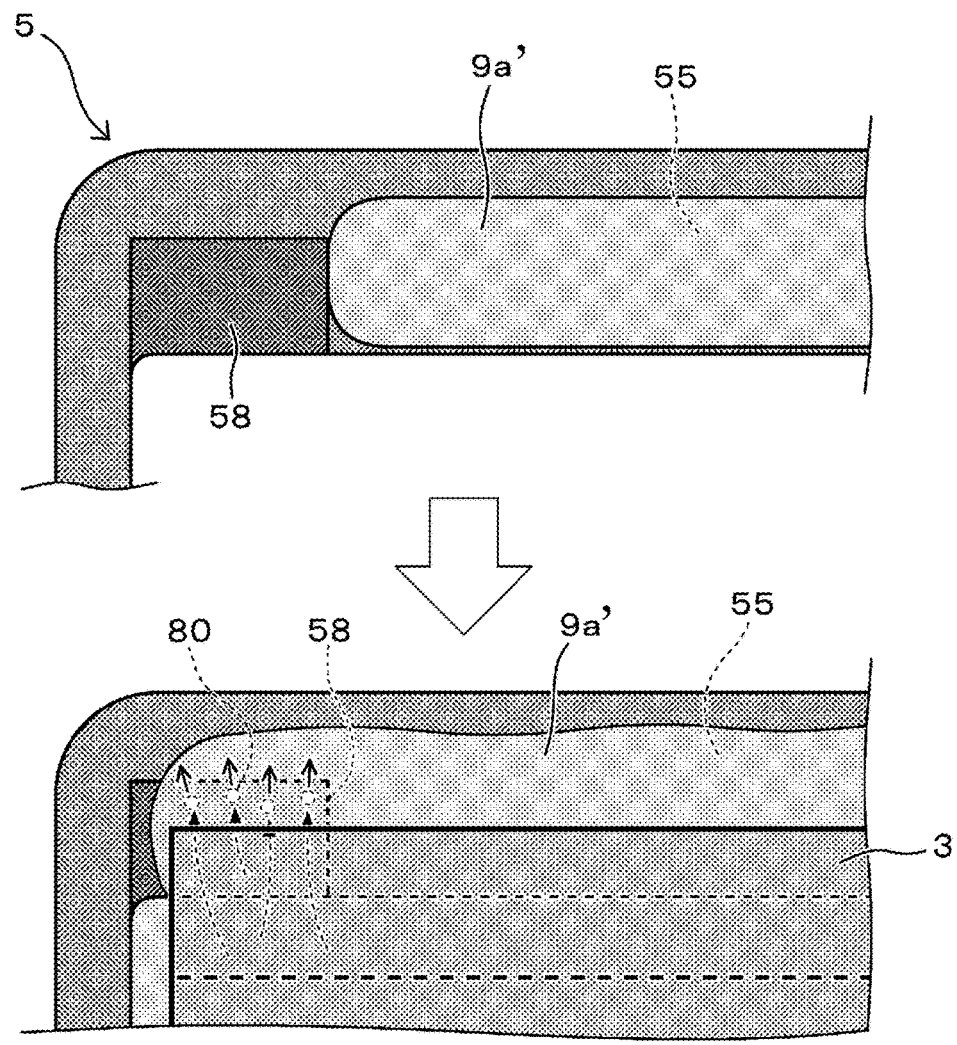
FIG. 6 is a schematic top view showing one example of a manufacturing method according to an embodiment.

As described above, the recessed portion 58 is continuous with the through hole 50 in the light-shielding frame 5. In other words, the light-shielding frame 5 has the recessed portion 58 that is open to the through hole. Such recessed portion 58 can serve as a guide for guiding and discharging voids of the light-reflective resin toward the outside, the voids being generated due to a movement of the light-reflective resin upon forming the optical member. For example, it is assumed as shown in FIG. 5 that a light-shielding resin 9a' is supplied onto the flat portion 55 of the second main surface 5b of the light-shielding frame upon the supply of the light-reflective resin. In such case, the light-transmissive member is brought into contact with and pressed against the light-reflective resin to make the light-reflective resin move into a gap between the light-transmissive member and the light-shielding frame in the optical member formation step, which allows the voids to be easily discharged to the outside through the recessed portion. The recessed portion is continuous with the through hole 50, and has a larger space where the light-shielding frame and the through hole of the light-transmissive member face each other, compared to that of the flat portion. Accordingly, the light-reflective resin can easily move along the recessed portion upon pressing the light-reflective resin. Thus, with the movement of the light-reflective resin 9a', the voids 80 also move relatively easily to the recessed portion 58, resulting in an easy escape of the voids 80 to the outside through the recessed portion 58 as shown in FIG. 6.

Figure 7A:
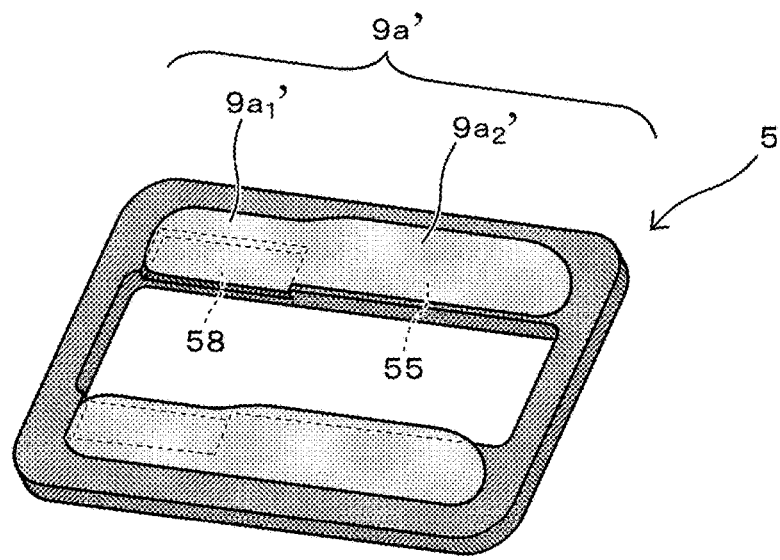
FIG. 7A is a schematic perspective view showing one example of a manufacturing method according to an embodiment.
Figure 7B:
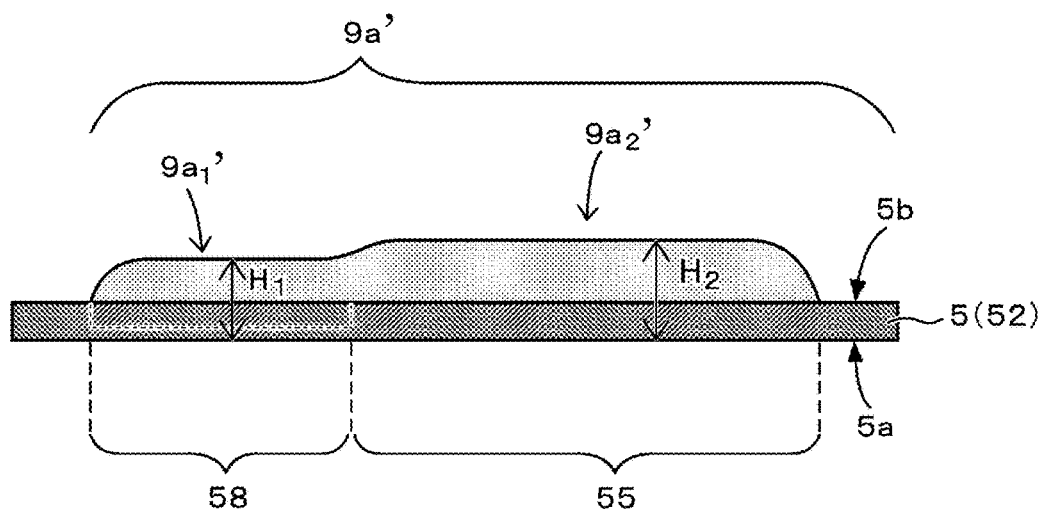
FIG. 7B is a schematic side view showing one example of the manufacturing method according to the embodiment.

The recessed portion 58 corresponds to a groove by which the light-shielding frame 5 is partially thinned. When the light-reflective resin is supplied onto such light-shielding frame, the height of the supplied light-reflective resin over the light-shielding frame 5 is not entirely uniform, which is attributable to the recessed portion. As shown in FIGS. 7A and 7B for example, when the light-reflective resin 9a' is supplied on the recessed portion 58 as well as the flat portion 55 in the light-reflective resin supply step, the height of the light-reflective resin 9a' on the light-shielding frame 5 becomes locally different. That is, the height from the first main surface of the light-shielding frame to a portion of the light-reflective resin 9a' positioned on the recessed portion 58 is lower than the height from the first main surface of the light-shielding frame to a portion of the light-reflective resin 9a' positioned on the flat portion 55. Such locally-different height of the light-reflective resin located over the light-shielding frame can also inhibit the generation of voids in the forming of the first light-reflective member. Specifically, the third surface 3e of the light-transmissive member is brought into contact with the light-reflective resin and thereby the light-reflective resin is pressed in the optical member formation step so as to dispose the light-reflective resin into the gap between the first lateral surface of the light-transmissive member and the inner lateral surface defining the through hole of the light-shielding frame. In this regard, the light-transmissive member and the light-reflective resin can contact with each other with a time lag upon the pressing because the height of the light-reflective resin is locally different. Such time lag of the contact can facilitate the escape of air from the gap to the outside, so that the generation of voids is inhibited.

The overall structure and respective components of the light-emitting device according to the present embodiment will be described below.

In the light-emitting device according to the present embodiment, the light-transmissive member 3 has the first surface 3a which serves as a light exit surface of the light-emitting device, and the second surface 3b that is opposite to the first surface. The first surface 3a of the light-transmissive member 3 has its outer perimeter that is smaller than the inner perimeter of the through hole of the light-shielding frame 5. As shown in FIG. 1, the area of the second surface 3b of the light-transmissive member 3 is larger than the area of the first surface 3a of the light-transmissive member 3 in a top view. The outer perimeter of the first surface 3a is inside the outer perimeter of the second surface 3b in the light-transmissive member 3 in a top view. A part of the outer perimeter of the first surface 3a of the light-transmissive member 3 may coincide with the outer perimeter of the second surface 3b of the light-transmissive member 3 in a top view.

The first surface 3a of the light-transmissive member 3 having a smaller area than that of the second surface 3b of the light-transmissive member 3 allows light emitted from the light-emitting elements 1 incident on the second surface 3b of the light-transmissive member 3 to output from the first surface 3a having the smaller area. In other words, the area of the light-emitting surface is narrowed down through the light-transmissive member 3, so that a more distant place can be illuminated at high luminance. Light-emitting devices with high front luminance are particularly suitable for vehicle lights, such as headlights. There are various regulations and standards for the colors of vehicle lights, such as those that the colors of light emitted from all headlights of a vehicle must be the same, and must be white or pale yellow.

The sizes of the first surface 3a and the second surface 3b in the light-transmissive member 3 are different as described above, and thus the light-transmissive member 3 has a flange 30. Specifically, as shown in FIGS. 8A and 8B, the light-transmissive member 3 has the first lateral surface 3c that is continuous with the first surface 3a, the second lateral surface 3d that is located outside of the first lateral surface 3c and is continuous with the second surface 3b, and also the third surface 3e that is continuous with the first and second lateral surfaces 3c and 3d. As shown in FIGS. 8A and 8B, the light-transmissive member 3 is configured such that the flange 30 is composed of a part of the second surface 3b, the third surface 3e and the second lateral surface 3d. To put it briefly, the light-transmissive member 3 is provided with the flange 30 because the area of the second surface 3b is larger than the area of the first surface 3a.

The outer perimeter of the second surface 3b of the light-transmissive member 3 is at least partially located outside of the inner perimeter of the through hole 50 of the light-shielding frame 5 in a top view of the light-emitting device. In the light-emitting device of the embodiment shown in FIG. 1, a part of the outer perimeter of the second surface 3b, which is continuous with the second lateral surface 3d of the light-transmissive member 3, is located outside of the inner perimeter of the through hole 50 in a top view. For example, in a case in which the outer perimeter of the second surface 3b of the light-transmissive member 3 has a rectangular shape, at least one side, for example, two opposite sides, preferably two longer sides opposite to each other, of the outer perimeter of the second surface 3b can be located outside of the inner perimeter of the through hole 50 of the light-shielding frame 5.

In this suitable embodiment, a part or the whole of the outer perimeter of the second surface 3b of the light-transmissive member 3 is located outside of the inner perimeter of the through hole 50 in a top view. Also, the outer perimeter of the first surface 3a of the light-transmissive member 3 is entirely located inside of the inner perimeter of the through hole 50 in a top view. Further, in this case, the light-emitting elements of the light-emitting device are located inside of the outer perimeter of the second surface 3b of the light-transmissive member 3.

That is, in the light-emitting device of the present embodiment, the first surface 3a of the light-transmissive member 3 and the upper surface of the first light-reflective member 9a surrounding the outer perimeter of the first surface 3a are located in the through hole 50 of the light-shielding frame 5 in a top view (i.e., when viewed from the light exit surface of the light-emitting device). In this case, inside the through hole 50 of the light-shielding frame 5, the light-transmissive member 3 is at least partially located at the region below the first light-reflective member 9a. With this structure, even if cracks and/or delamination are caused in the first light-reflective member 9a, light leaking out from the through hole 50 is likely to be constituted by only light emitted from the light-transmissive member 3 in regard to the portion in which the light-transmissive member 3 is located inward of the through hole 50.

In a case in which the outer perimeter of the second surface 3b of the light-transmissive member 3 has a rectangular shape with its longer sides and shorter sides, at least the longer sides of the outer perimeter of the second surface 3b are preferably located outside of the inner perimeter of the through hole 50 of the light-shielding frame 5 (i.e., outside of the inner frame perimeter defining the through hole of the light-shielding frame 5). This makes it possible for the light-emitting device to have a light distribution pattern that is wider in the longer-side direction than that in the shorter-side direction, which is suitable for vehicle lights or the like.

Further, as for the upper surface of the light-emitting device, light leaking out from the light-reflective member 9 is blocked by the light-shielding frame 5 in the region covered with the light-shielding frame 5. Thus, even if the cracks and/or delamination are caused in the second light-reflective member 9b located on the lateral sides of the light-emitting elements 1, light emitted from the lateral surfaces of the light-emitting elements 1 is more effectively inhibited from being leaked and transmitted to the light exit surface through the cracks and/or the delaminated portion.

In a configuration of the light-emitting device according to the present embodiment, as shown in FIG. 1, the outer perimeter of the first surface 3a of the light-transmissive member 3 is at least partially located inside of the outer perimeter of the light-emitting elements 1 in a top view. For example, in a case in which the first surface 3a of the light-transmissive member 3 has a substantially rectangular shape, the longer side(s) of the rectangular shape can be located inside of an outer perimeter of the light-emitting elements 1, the outer perimeter being located at the longer side of the light-transmissive member.

With this structure, light emitted from a plurality of light-emitting elements 1 is condensed before exiting from the first surface 3a of the light-transmissive member 3. The light emitted from the light-emitting elements 1 can thus exit from the first surface 3a of the light-transmissive member 3 (i.e., from the light exit surface of the light-emitting device) at a higher luminous flux density.

Board

The board 10 is a member for supporting the light-emitting elements 1 and other components. The board 10 may be a substrate or a mounting board. At least the surface of the board 10 is provided with a wiring that is in electrical connection to the light-emitting elements 1. It is preferred that a main material of the board 10 is an insulating material that is unlikely to transmit light emitted from the light-emitting elements 1 and extraneous light. Specifically, for example, a ceramic such as alumina and aluminum nitride, or at least one resin selected from among phenolic resins, epoxy resins, silicone resins, polyimide resins, BT resins, and polyphthalamide can be used. In a case in which a resin is used, at least one inorganic filler selected from among glass fiber, silicon oxide, titanium oxide, alumina, and the like may be mixed with the resin as appropriate. This can improve the mechanical strength and the light reflectance, and/or reduce the thermal expansion coefficient, for example. The board 10 may be one composed of a metal member and a wiring wherein the wiring is provided on the surface of the metal member via an insulating material. The wiring may be formed into a predetermined pattern on the insulating material. The material of the wiring can be at least one selected from among Au, Ag, Cu, Fe, Ti, Pd, Ni, Cr, Rt, W and Al. The wiring can be formed by plating, vapor deposition, and/or sputtering.

Light-Emitting Element

A light-emitting diode is preferably used as the light-emitting element 1. The light-emitting element 1 that emits light having appropriately selected wavelength can be used. For example, at least one selected from among nitride semiconductors ($In_XAl_YGa_{1-X-Y}N$, where $0 \le X$, $0 \le Y$, and $X+Y \le 1$), ZnSe, and GaP can be used for a blue or green light-emitting element. For a red light-emitting element, GaAlAs and/or AlInGaP can be used. Semiconductor light-emitting elements made of other materials can also be used. The composition, emission color, size and/or number of the light-emitting elements to be used can be appropriately selected according to the purpose. In a case in which the light-emitting device contains a phosphor, a nitride semiconductor ($In_XAl_YGa_{1-X-Y}N$, where $0 \le X$, $0 \le Y$, and $X+Y \le 1$) is suitable because it can emit light with short wavelengths that can efficiently excite the phosphor. The emission wavelength can be selected by changing the material for the semiconductor layer and/or its mixing ratio.

For example, the light-emitting element 1 used in the light-emitting device of the present embodiment includes positive and negative electrodes on the same surface. The light-emitting element 1 can be flip-chip mounted on the board 10 with electrically-conductive bonding members 11 therebetween as shown in FIG. 2A. The electrically-conductive bonding members 11 connected to the positive and negative electrodes of the light-emitting element 1 are simplified in FIG. 2A, but each of the electrically-conductive bonding members 11 is actually in connection with respective one of the positive and negative electrodes disposed on the same surface. Each of the positive and negative electrodes of the light-emitting element 1 is in connection to respective one of positive and negative portions of the wiring disposed over the board 10 with the electrically-conductive bonding member 11 therebetween. The light-emitting element 1 has a lower surface provided with the electrodes and facing the board, and has an upper surface of the light-emitting element 1 opposite to the lower surface, the upper surface serving as the main light exit surface. Such a light-emitting element 1 is connected to the board using electrically-conductive bonding members such as bumps and electrically-conductive paste as described above, so that the area of contact between the electrodes and the board is large, compared with the case of a light-emitting element that is connected using metal wires or the like. Accordingly, the contact resistance is reduced.

Examples of the electrically-conductive bonding member include bumps made of Au, Ag, Cu, or an alloy containing any one of these materials; solders such as Sn—Bi, Sn—Cu, Sn—Ag, and Au—Sn; conductive pastes made of eutectic alloys such as an alloy containing Au and Sn as main components, an alloy containing Au and Si as main components, and an alloy containing Au and Ge as main components, or conductive pastes of Au, Ag, Pd and/or other element; anisotropic conductive materials such as ACP and/or ACF; brazing materials made of low-melting-point metal; and electrically-conductive adhesives or electrically-conductive composite adhesives containing any combination of the above-described materials.

The shape of the light-emitting element 1 is, for example, rectangular in a top view.

The light-emitting element 1 is formed by, for example, layering a nitride semiconductor layer on a light-transmissive supporting substrate. The supporting substrate is at the upper side of the light-emitting element 1, serving to provide a main light exit surface of the element (i.e., the upper surface of the element). The supporting substrate can be removed by, for example, abrasion and/or laser lift-off.

Light-Transmissive Member

The light-transmissive member 3 transmits light emitted from the light-emitting element 1, and outputs the light to the outside. The light-transmissive member 3 transmits 60% or more and preferably 70% or more of the light emitted from the light-emitting element(s) 1 and/or light (for example, light with a wavelength in the range of 320 nm to 850 nm) obtained by converting the wavelength of the light from the light-emitting element(s) 1.

The light-transmissive member 3 has the first surface 3a that practically serves as the light exit surface of the light-emitting device, the second surface 3b that is opposite to the first surface, the first lateral surface 3c that is continuous with the first surface 3a, the second lateral surface 3d that is located outside the first lateral surface 3c and is continuous with the second surface 3b, and the third surface 3e that is continuous with the first lateral surface 3c and the second lateral surface 3d. The area of the second surface 3b of the light-transmissive member 3 is larger than the area of the first surface 3a of the light-transmissive member 3. As described above, the light-transmissive member 3 includes the flange 30 on its lateral side. The flange 30 is composed of a part of the second surface 3b, the third surface 3e and the second lateral surface 3d.

The light-transmissive member 3 can be made of any one of inorganic materials such as glass, ceramics and sapphire, and organic materials such as resins and hybrid resins containing one or more types of silicone resins, modified silicone resins, epoxy resins, modified epoxy resins, acrylic resins, phenolic resins and fluorine resins.

The light-transmissive member 3 can contain a light-diffusing material or a phosphor that can perform wavelength conversion of at least a part of incident light. Examples of the light-transmissive member containing the phosphor include a sintered body of a phosphor and a mixture of a phosphor and the material described above. Alternatively, a mold or compact of resin, glass, and/or a ceramic provided with a layer containing a phosphor on its surface can be used. The overall thickness of the light-transmissive member 3 from the first surface to the second surface is, for example, about 50 µm to 300 µm.

The light-transmissive member 3 can be bonded to the light-emitting elements 1 using, for example, a light guide member 13 as shown in FIG. 2A. The light-transmissive member 3 can be directly bonded to the light-emitting elements 1 by compression, surface-activated bonding, atomic diffusion bonding, and/or hydroxy-group bonding without the light guide member 13.

The phosphor that can be excited by light emitted from the light-emitting elements 1 is used as the phosphor that can be contained in the light-transmissive member 3. For example, a phosphor that can be excited by a blue or ultraviolet light-emitting element can be at least one selected from among cerium-activated yttrium-aluminum-garnet based phosphors (YAG:Ce); cerium-activated lutetium-aluminum-garnet based phosphors (LAG:Ce); europium- and/or chromium-activated nitrogen-containing calcium aluminosilicate based phosphors ($CaO-Al_2O_3-SiO_2$:Eu); europium-activated silicate based phosphors (($Sr,Ba)_2SiO_4$:Eu); nitride based phosphors such as β-SiAlON phosphors, CASN based phosphors represented by $CaAlSiN_3$:Eu, and SCASN based phosphors represented by $(Sr,Ca)AlSiN_3$:Eu; KSF based phosphors represented by $K_2SiF_6$:Mn; sulfide-based phosphors; and quantum-dot phosphors. A light-emitting device that emits light in a desired color (e.g., a light-emitting device that emits white light) can be manufactured by appropriately combining these phosphors and blue or ultraviolet light-emitting elements.

The shape of each of the first and second surfaces of the light-transmissive member is, for example, a quadrangular shape in a top view. The term "quadrangular shape" as used herein refers to a substantially quadrangular shape and broadly refers to squares, rectangles, parallelograms, and trapezoids. Among them, the rectangular shape is preferable in consideration of processability and correspondence to the shape of the light-emitting element. For example, in a case in which a plurality of light-emitting elements 1 are bonded to the second surface of the single light-transmissive member, the second surface of the light-transmissive member 3 preferably has the shape and size capable of covering all the light-emitting elements 1.

In a case in which the first surface of the light-transmissive member has a rectangular shape, it is preferred that a pair of flanges can be provided on opposed sides of the rectangular shape. That is, it is preferred that the flanges are provided on at least a set of sides opposite to each other in the rectangular shape. This makes it possible for a first coating member to easily serve to bond the light-transmissive member and the light-shielding frame with each other. In this regard, the first surface 3a and the second surface 3b of the light-transmissive member 3 each have rectangular shape (or oblong shape) in a top view as shown in FIG. 1, for example. In a case in which the first surface of the light-transmissive member has a rectangular shape in a top view, it is preferred that a pair of flanges is provided at least on longer sides opposite to each other in the rectangular shape.

Light-Shielding Frame

The light-shielding frame 5 is disposed in order to reduce the luminance of the portion other than the light exit surface in the upper surface of the light-emitting device. To reduce the luminance of the portion other than the light exit surface, light leaking out from the portion other than the first surface 3a of the light-transmissive member 3 to the outside is required to be blocked. Considering this function, for example, the light-shielding frame 5 is preferably a member made of a material that reflects and/or absorbs light without transmitting light or a member provided with, on its surface, a film made of a material that reflects and/or absorbs light.

The light-shielding frame 5 used in the light-emitting device according to the present embodiment includes a portion in which the thickness of the frame part (i.e., a distance from the first main surface to the second main surface) is not constant. In this regard, the light-shielding frame 5 is provided with the recessed portion 58 by which partially small thicknesses of the frame is given. In particular, the recessed portion 58 is positioned in the second main surface that is opposite to the first main surface located at the light exit surface side of the light-emitting device, and also the recessed portion 58 is continuous with the through hole 50.

More specifically, as shown in FIGS. 3 and 4, the light-shielding frame 5 has the first main surface 5a, and the second main surface 5b opposite to the first main surface 5a, and also defines the through hole 50 that penetrates from the first main surface 5a to the second main surface 5b. The second main surface 5b has the flat portion 55 and the recessed portions 58 as shown in FIGS. 3 and 4. In particular, the recessed portion 58 is shaped to extend or be connected to the through hole 50.

The material constituting the light-shielding frame 5 can be selected from among resins (including fiber-reinforced resins), ceramics, glass, paper, metals, and a composite material made of two or more of these materials. The light-shielding frame 5 is preferably made of a material that has good light-blocking properties and is unlikely to deteriorate. In consideration of the properties of such a material, the light-shielding frame 5 is preferably constituted by a metal frame made of metal or a frame provided with a metal film on its surface, for example. Examples of such metal material include Cu, Fe, Ni, Cr, Al, Au, Ag, Ti, and alloys of these metals.

The light-shielding frame 5 more preferably has the function of inhibiting reflection of extraneous light, in addition to the function of inhibiting leakage of light from the inside of the light-emitting device. To obtain the function of inhibiting reflection of extraneous light, for example, minute irregularities (i.e., fine protrusion and/or depression) can be provided on the first main surface located at the light exit surface side, or a material with high light absorptivity can be used. The arithmetic mean roughness Ra of the minute irregularities is, for example, 0.5 µm or more and 1.0 µm or less. In a case in which the surface of the light-shielding frame 5 has the minute irregularities, wettability of the surface of the light-shielding frame for a liquid is increased, and the resin material constituting each member tends to wet-spread over the surface of the light-shielding frame. Hence, for example, the minute irregularities are preferably not formed on the edges of the first main surface of the light-shielding frame 5. Examples of the material with high light absorptivity include black nickel plating and black chromium plating.

The thickness of the light-shielding frame 5 (i.e., the distance from the first main surface to the second main surface in the flat portion of the light-shielding frame 5) is preferably in the range of about 20 µm to 200 µm, and more preferably about 30 µm to 80 µm, in consideration of the lightweight and/or the resistance to deformation of the light-shielding frame 5 as well as its strength to be maintained when the light-shielding frame 5 is used for the light-emitting device.

The light-shielding frame 5 can be disposed such that its outer perimeter corresponds to the outer perimeter of the light-emitting device in a top view. Alternatively, the light-shielding frame 5 is preferably disposed such that its outer perimeter is located inside of the outer perimeter of the light-emitting device. This structure can inhibit misalignment and the like of the light-shielding frame 5 in a division step of dividing the undivided light-emitting devices into unit regions (i.e., into individual regions corresponding to the respective light-emitting devices) because the light-shielding frame 5 is not disposed on the dividing lines.

The statement that the light-shielding frame 5 is disposed such that the outer perimeter of the light-shielding frame 5 is located inside of the outer perimeter of the light-emitting device includes the state in which the light-shielding frame 5 is disposed such that a part of the outer perimeter of the light-shielding frame 5 is located inside of the outer perimeter of the light-emitting device.

The width of the light-shielding frame 5 surrounding the light-transmissive member 3 in a top view is preferably 130 µm or more in consideration of increase in the difference in luminance between the inside and the outside of the first surface 3a of the light-transmissive member 3, the first surface 3a serving as the light exit surface of the light-emitting device. In particular, such width is more preferably, for example, 500 µm or more in consideration of the ease of handling in the manufacturing process.

The width of the light-shielding frame 5 may be constant along a surrounding form of the frame, or may also be partially different therealong. When the width of the light-shielding frame 5 is partially different, it is more preferred that this width is at least 130 µm or more across the entirety of the frame part, and also 500 µm or more in part. The term "width" regarding the light-shielding frame 5 as used herein means the distance from the inner frame perimeter defining the through hole 50 to the outer perimeter of the light-shielding frame 5.

Light-Reflective Member

The light-reflective member may include the first light-reflective member 9a that bonds the light-shielding frame 5 and the light-transmissive member 3 with each other. The light-reflective member may also include the second light-reflective member 9b that is disposed between the first light-reflective member 9a and the board 10 to cover the lateral surfaces of the light-emitting elements 1.

The light-reflective member 9 covers the lateral surfaces of the light-emitting elements 1 and the lateral surfaces of the light-transmissive member 3, and reflects light emitted from the lateral surfaces of the light-emitting elements 1 and/or the lateral surfaces of the light-transmissive member 3 to allow the reflected light to be emitted from the first surface 3a of the light-transmissive member 3, the first surface 3a serving as the light exit surface of the light-emitting device. The light extraction efficiency of the light-emitting device is increased by the presence of the light-reflective member 9 covering the lateral surfaces of the light-emitting elements 1 and the lateral surfaces of the light-transmissive member 3 as described above. The light-reflective member has a reflectance of 60% or more, and preferably 90% or more with respect to light from the light-emitting element. The light-reflective member can be formed from, for example, a resin containing a light-reflective material (hereinafter also referred to as a light-reflective resin). As described below in detail, the first light-reflective member 9a and the second light-reflective member 9b are individually formed, and can be made of different light-reflective resins from each other or the same light-reflective material as each other.

Examples of the resin of a base material constituting the light-reflective member 9 include resins such as silicone resins, modified silicone resins, epoxy resins, modified epoxy resins, polyester resins, polyimide resins, modified polyimide resins, polyphthalamide (PPA), polycarbonate resins, polyphenylene sulfide (PPS), liquid crystal polymers (LCPs), ABS resin, phenolic resins, acrylic resins, and PBT resin. Hybrid resins containing at least one of these resins can also be used. Among them, a silicone resin with excellent resistance to heat and light is preferably used. It is preferable to use a light-reflective substance that is unlikely to absorb light emitted from the light-emitting elements and has a large difference in the reflux index with respect to that of the resin of the base material. Specifically, at least one selected from among titanium oxide, silicon oxide, zirconium oxide, magnesium oxide, yttrium oxide, calcium carbonate, calcium hydroxide, calcium silicate, niobium oxide, zinc oxide, barium titanate, potassium titanate, magnesium fluoride, alumina, aluminum nitride, boron nitride, and mullite can be used for the light-reflective substance. Among them, titanium oxide is preferably used in terms of light reflection because its refractive index is relatively high. Particles having a refractive index different from that of the base resin can be dispersed as the light-reflective substance in the base resin. The reflectance of the obtained light-reflective member varies depending on the material, the concentration and/or the like of the light-reflective substance in the base material or resin, and accordingly a desired material, concentration and/or the like can be appropriately adjusted according to the shape and/or size of the light-emitting device.

The light-reflective member can contain a filler for adjusting a viscosity, another pigment and/or phosphor in addition to the light-reflective substance. In particular, in a case in which the light-transmissive member 3 contains a phosphor, incorporating substantially the same phosphor into the second light-reflective member 9b covering the lateral surfaces of the light-emitting elements can suppress the leakage of light emitted from the light-emitting elements from being visually recognized from the lateral surfaces of the light-emitting device.

Light Guide Member

In the light-emitting device, the light-transmissive member 3 and the light-emitting elements 1 can be bonded to each other using the light guide member 13. The light guide member 13 is interposed between the light-emitting elements 1 and the light-transmissive member 3 to bond them with each other. The light guide member 13 preferably covers a part or the whole of the lateral surfaces of the light-emitting elements 1 as shown in FIG. 2A. The light guide member 13 having such structure can efficiently guide light emitted from the upper surfaces and the lateral surfaces of the light-emitting elements 1 to the light-transmissive member 3.

The light guide member 13 is preferably made of a resin material because the resin materials are easy to handle and process. As the resin for the light guide member 13, the resins that have been exemplified for the light-reflective member can also be used.

Other Members

The light-emitting device can include other semiconductor elements such as a protective element and electronic components as appropriate. It is preferred that these members are disposed on the board 10 and embedded in the light-reflective member. Further, these members can be electrically connected to the light-emitting device via the wirings of the board 10. To reduce the size of the light-emitting device, at least a part of the component is preferably disposed to overlap the light-shielding frame in a top view. For example, the light-emitting device may include the protective element 6 that is in embedment in a light-reflective member such that a part of the protective element 6 is positioned directly under the light-shielding frame 5.

Method of Manufacturing Light-Emitting Device of Embodiment

A method of manufacturing a light-emitting device according to an embodiment at least includes: placing a light-emitting element onto a board; providing a light-shielding frame; supplying a light-reflective resin to the light-shielding frame; providing a light-transmissive member; forming an optical member in which the light-shielding frame and the light-transmissive member are bonded to each other by a light-reflective member; and bonding the light-emitting element and the optical member to each other.

For example, the light-emitting device of the embodiment shown in FIG. 1 and FIGS. 2A and 2B can be obtained by the manufacturing method of the present embodiment. The manufacturing method of the present embodiment is described with reference to the accompanying drawings.

Placing Step

Figure 9A:
FIG. 9A is a schematic sectional view showing one example of a manufacturing method according to an embodiment.
Figure 9B:
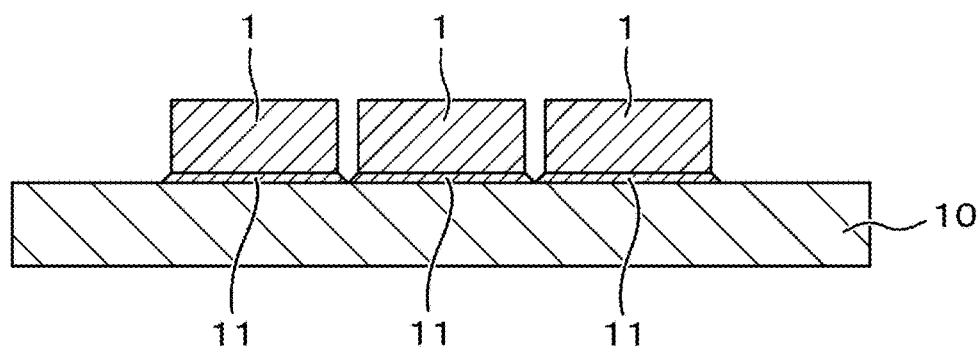
FIG. 9B is a schematic sectional view showing one example of the manufacturing method according to the embodiment.

In this step, the light-emitting element is placed on the board. For example, as shown in FIGS. 9A and 9B, at least one light-emitting element 1 is flip-chip mounted on the board 10. Specifically, for example, the light-emitting elements 1, each including positive and negative electrodes on the same lower surface thereof, are bonded to the electrically-conductive bonding members 11 such that the positive and negative electrodes face the respective wirings disposed on the board 10. Similarly to FIG. 2A and other drawings, the electrically-conductive bonding members 11 in FIG. 9B are simplified without differentiating electrically-conductive bonding members 11 connected to the positive and negative electrodes of the light-emitting element 1 and electrically-conductive bonding members 11 connected to the positive and negative portions of the wirings disposed on the board 10.

The light-emitting elements 1 can be each prepared through a part of or the whole manufacturing steps, such as a semiconductor growing step. Alternatively, the light-emitting elements 1 can be each prepared by purchase or other means, and thus may be commercially available ones, for example.

Light-Shielding Frame Providing Step

In this step, the light-shielding frame 5 is provided such that it has the first main surface 5a, the second main surface 5b opposite to the first main surface 5a, and the through hole 50 that penetrates from the first main surface 5a to the second main surface 5b. As shown in FIGS. 3 and 4, the light-shielding frame 5 has the flat portion 55 and the recessed portion 58 in the second main surface 5b. The recessed portion 58 is located such that it is continuous with the through hole 50 in the light-shielding frame 5. The light-shielding frame 5 may be provided, for example, by providing a light-shielding frame having a frame part 52 with a constant thickness, and then etching such light-shielding frame, and thereby forming the recessed portion 58 in the second main surface 5b. Alternatively, the recessed portion 58 may be formed using a machining means such as cutting means and/or pressing means. For example, the light-shielding frame having the through hole 50 and the recessed portion therein may be formed by providing a plate-shaped member having light-shielding properties, followed by the above-described machining thereof.

The provision of the light-shielding frame 5 may be provided by purchasing a light-shielding frame that has been machined into the above-described desired shape, and thus the light-shielding frame 5 may be commercially available one, for example.

Light-Reflective Resin Supply Step

In this step, the light-reflective resin 9a' is supplied onto at least the flat portion 55 of the second main surface 5b of the light-shielding frame 5.

Figure 10A:
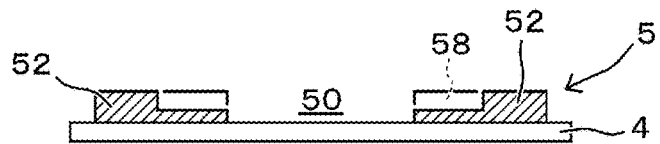
FIG. 10A is a schematic sectional view showing one example of the manufacturing method according to the embodiment.

It is preferred that the supply of the light-reflective resin 9a' onto the light-shielding frame 5 is performed while the light-shielding frame is secured to a supporter such as a sheet. Specifically, as shown in FIG. 10A, the light-shielding frame 5, which has the through hole 50 and the frame part 52 for defining the through hole 50, is secured to the sheet 4 such that the first main surface 5a of the light-shielding frame 5 faces the sheet 4.

In such a case, a plurality of light-shielding frames previously processed into a predetermined desired shape may be provided and individually disposed on the sheet, thereby providing the plurality of light-shielding frames coupled in the row direction and/or the columnar direction, which means that they can be disposed collectively on the sheet. The sheet may be a heat-resistant sheet with an adhesive surface thereof. For example, a polyimide can be used as a base material of the sheet.

Figure 10B:
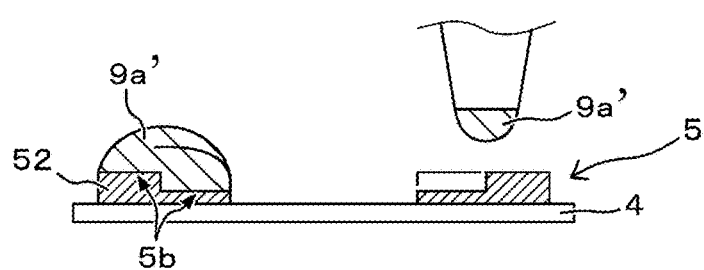
FIG. 10B is a schematic sectional view showing one example of the manufacturing method according to the embodiment.

Then, the light-reflective resin 9a' is supplied onto the second main surface 5b of the light-shielding frame. Specifically, as shown in FIG. 10B, the light-reflective resin 9a' is supplied onto the second main surface 5b of the light-shielding frame 5. It is preferred that the light-reflective resin 9a' is supplied at least on the flat portion of the second main surface 5b.

The supplied amount of the light-reflective resin 9a' may be one that enables the light-reflective resin to be disposed between the first lateral surface 3c of the light-transmissive member 3 and the inner lateral surface 5c defining the through hole 50 and between the third surface of the light-transmissive member 3 and the second main surface 5b of the light-shielding frame 5. For example, the viscosity and amount of the light-reflective resin 9a' to be supplied can be adjusted to such an extent that it wet-spreads over the substantially entire second main surface 5b of the light-shielding frame 5 but it does not flow out of the second main surface 5b toward the through hole 50 in the light-shielding frame 5.

The light-reflective resin 9a' may be supplied by using any of the methods known in the related art. The light-reflective resin 9a' can be supplied onto the light-shielding frame 5, for example, by continuously or discontinuously discharging the resin from the tip of a nozzle of a resin discharging device. For example, the light-reflective resin 9a' can be supplied linearly over the light-shielding frame 5 by continuously discharging and applying the light-reflective resin 9a' from the nozzle while moving the nozzle along the contour of the through hole.

The viscosity of the light-reflective resin 9a' is, for example, 5 Pa·s or more and 15 Pa·s or less during the supply of the light-reflective resin 9a', which can more easily ensure that the light-reflective resin flows into the gap between the light-transmissive member 3 and the through hole 50, and also can more easily inhibit the light-reflective resin from wet-spreading onto the first surface 3a of the light-transmissive member 3.

Light-Transmissive Member Providing Step

In this step, the plate-shaped light-transmissive member provided with the flanges is provided. Specifically, as shown in FIGS. 1, 8A and 8B, the light-transmissive member 3 is provided such that it has the first surface 3a having its outer perimeter smaller than the inner perimeter of the through hole of the light-shielding frame (i.e., the inner perimeter of the frame part), the second surface 3b that is opposite to the first surface 3a, the first lateral surface 3c that is continuous with the first surface 3a, the second lateral surface 3d that is positioned outside of the first lateral surface 3c and is continuous with the second surface 3b, and the third surface 3e that is continuous with the first and second lateral surfaces 3c and 3d.

The light-transmissive member can be fabricated by any of the conventional methods. The light-transmissive member provided with the flange, which is in a form of plate as a whole, may be fabricated through a cutting process using a machining means such as a blade, for example. Alternatively, the provision of the light-transmissive member may be given by purchasing one that has been already processed into a desired shape, and thus the light-transmissive member may be commercially available one, for example.

Optical Member Formation Step

FIGS. 10C to 10F are sectional views showing an optical member formation step.

In this step, the light-shielding frame 5 and the light-transmissive member 3 are bonded together by the first light-reflective member 9a to form the optical member. Specifically, by using of the light-transmissive member 3, the supplied light-reflective resin 9a' on the light-shielding frame 5 is forced to be disposed into the gap between the light-transmissive member 3 and the through hole 50 of the light-shielding frame 5, followed by being cured to form the first light-reflective member 9a. This can lead to a production of the optical member 60 in which the light-shielding frame 5 and the light-transmissive member 3 are supported by the first light-reflective member 9a.

In the optical member formation step, the light-transmissive member 3 is disposed in the through hole at a position where the first lateral surface of the light-transmissive member 3 is spaced from the inner lateral surface defining the through hole 50 of the light-shielding frame 5 (i.e., the inner lateral surface of the frame part). In this regard, the third surface 3e of the light-transparent member 3 and the light-reflective resin 9a' are brought into contact with each other, and thereby causing the light-reflective resin 9a' to be pressed and move along the surfaces of the light-shielding frame 5 and the light-transmissive member 3. This allows the light-reflective resin to be disposed into the gap between the first lateral surface of the light-transmissive member and the inner lateral surface defining the through hole, and also into the space within the recessed portion. The disposed light-reflective resin 9a' is then cured to form the first light-reflective member 9a therefrom. In this way, the optical member 60 is formed wherein the light-shielding frame 5 and the light-transmissive member 3 are bonded with each other by the first light-reflective member 9a.

Figure 10C:
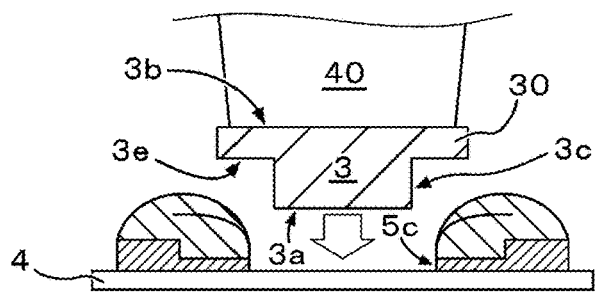
FIG. 10C is a schematic sectional view showing one example of the manufacturing method according to the embodiment.
Figure 10D:
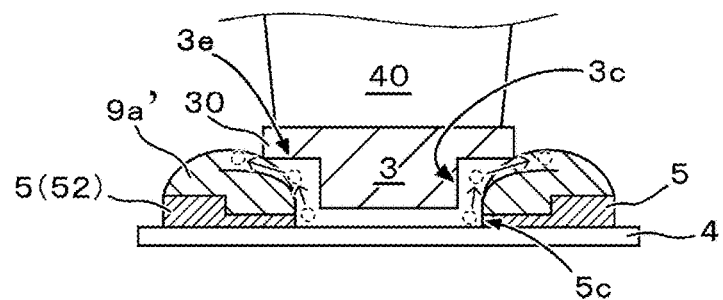
FIG. 10D is a schematic sectional view showing one example of the manufacturing method according to the embodiment.
Figure 10E:
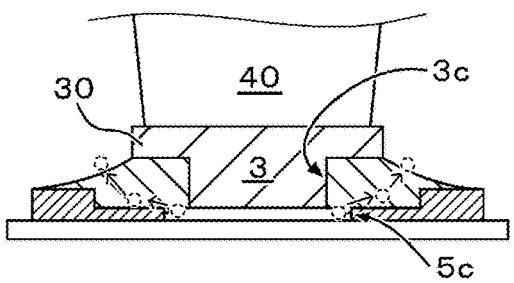
FIG. 10E is a schematic sectional view showing one example of the manufacturing method according to the embodiment.
Figure 10F:
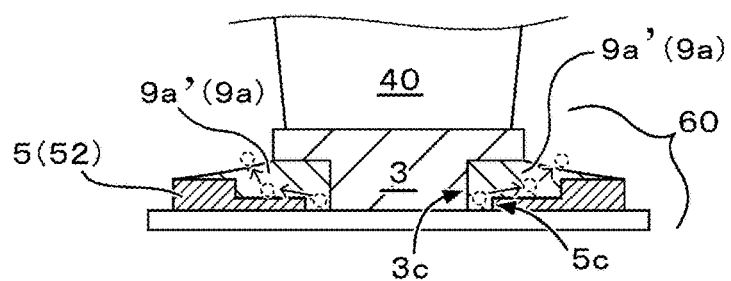
FIG. 10F is a schematic sectional view showing one example of the manufacturing method according to the embodiment.

As shown in FIG. 10F, a sink may be caused in the surface of the first light-reflective member 9a thus formed and between the light-shielding frame 5 and the light-transmissive member 3. In other words, the supplied light-reflective resin on the light-shielding frame 5 is pressed by the light-transmissive member 3 to move into the gap formed between the through hole and the light-transmissive member 3, so that the light-reflective resin remaining on the light-shielding frame 5 can be deformed along the light-transmissive member so as to keep its smaller surface area due to the surface tension.

As shown in FIGS. 10C to 10F, the disposition of the light-transmissive member 3 into the through hole of the light-shielding frame is performed preferably such that the third surface 3e of the light-transmissive member 3 and the light-reflective resin 9a' makes contact with each other before the first surface 3a of the light-transmissive member 3 is brought into contact with the sheet 4. Specifically, the light-transmissive member 3 is disposed within the through hole 50 such that the first surface 3a of the light-transmissive member 3 faces the sheet 4 at the position where the first lateral surface of the light-transmissive member 3 is spaced from the surface forming the through hole of the light-shielding frame 5. During this disposition, the light-transmissive member 3 makes contact with the light-reflective resin 9a' that having been supplied on the light-shielding frame 5. This can cause the light-reflective resin 9a' to be pressed by the light-transmissive member 3, and thereby allowing the light-reflective resin 9a' to move into the gap between the light-shielding frame 5 and the light-transmissive member 3.

More specifically, the light-transmissive member 3 is disposed such that a part of the second surface 3b of the light-transmissive member 3 is positioned outside of the inner perimeter of the through hole of the light-shielding frame 5 as shown in FIG. 10C. The third surface 3e of the light-transmissive member 3 is then brought into contact with the light-reflective resin 9a' as shown in FIG. 10D. Starting from this contact point, the light-reflective resin 9a' moves from the flange 30 of the light-transmissive member 3 toward the first lateral surface 3c as shown in FIG. 10E to be disposed into the gap between the first lateral surface 3c of the light-transmissive member 3 and the inner lateral surface 5c defining the through hole of the light-shielding frame 5 and also into the space within the recessed portion as shown in FIG. 10F. In a case in which the light-reflective resin 9a' has not been previously supplied into the recessed portion, the disposition of the light-reflective resin 9a' into the recessed portion 58 can be performed. In a case in which the through hole 50 of the light-shielding frame 5 and the second surface 3b of the light-transmissive member 3 both have rectangular shapes having longer sides and shorter sides, the light-transmissive member 3 and the light-shielding frame 5 may be disposed to each other such that a distance between the longer side of the second surface 3b and the longer side of the through hole 50 is substantially equal to a distance between the shorter side of the second surface 3b and the shorter side of the through hole 50 in a top view.

In the optical member formation step, a collet or the like can be used to dispose the light-transmissive member 3 into the through hole. For example, the light-transmissive member 3 picked up by a sucking means 40 such as the collet can be placed within the through hole, followed by being pressed by use of the suction means. This makes it possible for the light-reflective resin 9a' to contact with the third surface of the light-transmissive member 3 so as to move toward the desired region more quickly.

In a case in which the light-reflective resin 9a' of the light-reflective resin supply step has been previously provided in the recessed portion of the light-shielding frame 5 at a point in time before the optical member formation step, the contact of the flange 30 of the light-transmissive member 3 and the light-reflective resin 9a' that has been disposed on the light-shielding frame 5 is preferably such that the third surface of the light-transmissive member 3 is first brought into contact with an uppermost portion of the light-reflective resin 9a', the uppermost portion having the greatest height in the light-reflective resin 9a', followed by being brought into contact with other portions of the light-reflective resin 9a' with a time lag, which will be described below in more detail.

Optical Member Bonding Step

Figure 11A:
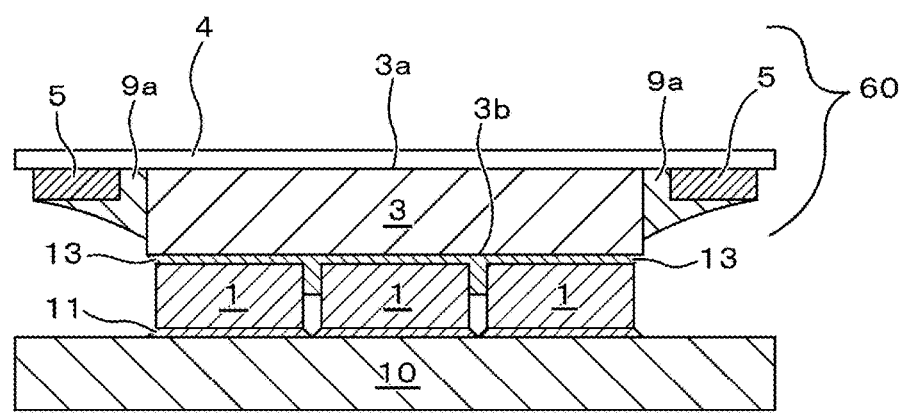
FIG. 11A is a schematic sectional view showing one example of the manufacturing method according to the embodiment.

In this step, the optical member 60 is bonded over the light-emitting elements 1 while the light-emitting surfaces (i.e., the upper surfaces) of the light-emitting elements 1 that have been placed on the board 10 face the second surface 3b of the light-transmissive member 3, as shown in FIG. 11A.

In other words, the second surface 3b of the light-transmissive member 3 in the optical member 60 is aligned with respect to the upper surfaces of the light-emitting elements 1, and therethrough the light-transmissive member 3 is bonded to the light-emitting elements 1 using the light guide member 13, for example.

To obtain the light-emitting device of the embodiment shown in FIG. 1 and FIGS. 2A and 2B, the position of the optical member 60 is adjusted such that: for example, (i) the outer perimeter of the second surface 3b of the light-transmissive member 3 is located outside of the outer perimeter of the light-emitting elements 1 in a top view; and (ii) at least one side of the first surface 3a, preferably the entire outer perimeter of the first surface 3a of the light-transmissive member 3 is located inside of the outer perimeter of the light-emitting elements 1 in a top view.

When the second surface 3b of the light-transmissive member 3 of the optical member 60 is bonded to the upper surfaces of the light-emitting elements 1, the light guide member 13 in its uncured state of resin may be preliminarily applied on the second surface 3b prior to the light-transmissive member 3 being placed over the light-emitting elements 1. Alternatively, the light guide member 13 in its uncured state of resin may be applied over the upper surfaces of the light-emitting elements 1, followed by the light-transmissive member 3 of the optical member 60 being placed over the light-emitting elements 1. The amount and viscosity of the resin to be applied for the light guide member 13, along with the load to be applied upon placing the light-transmissive member 3 over the light-emitting elements 1, can be appropriately selected in consideration of a desired shape of the light guide member 13.

Second Light-Reflective Member Formation Step

Figure 11B:
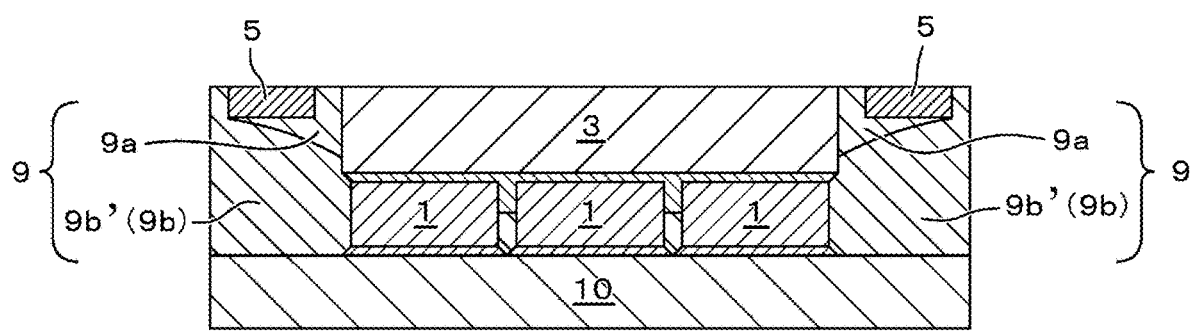
FIG. 11B is a schematic sectional view showing one example of the manufacturing method according to the embodiment.

In this step, the second light-reflective member 9b is formed as an optional light-reflective member. Specifically, a second light-reflective resin 9b' in its uncured state for forming the second light-reflective member 9b is disposed into the space between the board 10 and the light-shielding frame 5. This makes it possible for the second light-reflective member 9b to be formed such that it surrounds the light-emitting elements 1 and the light-transmissive member 3 between the board 10 and the light-shielding frame 5, as shown in FIG. 11B. The second light-reflective member 9b can constitute the integrated light-reflective member 9 in combination with the first light-reflective member 9a described above.

For example, in a case in which the light-shielding frame 5 having a smaller size than that of the board 10 (i.e., the frame 5 having such a size that the outer periphery thereof is encompassed by the board 10 in a top view) is used, the second light-reflective resin 9b' can be supplied into a gap between the board 10 and the light-shielding frame 5 from the outside of the light-shielding frame.

After the supply of the second light-reflective resin 9b' into the gap between the board 10 and the light-shielding frame 5, the supplied second light-reflective resin 9b' is cured to form the second light-reflective member 9b therefrom.

The light-emitting device according to the present embodiment can be manufactured as described above.

The above description has been made with reference to the drawings each showing a single light-emitting device.

However, in the method of manufacturing a light-emitting device according to the present embodiment, a plurality of light-emitting devices can be each produced as a unit by providing a board and a light-shielding frame both of which include a plurality of unit regions respectively corresponding to the individual light-emitting devices, and the resultant product can be then divided into the individual light-emitting devices.

For example, a collective board including a plurality of (n×m) unit regions configured by a plurality of rows (n rows) and a plurality of columns (m columns) can be used as the board.

Alternatively, for example, a light-shielding frame assembly with light-shielding frames that are connected with each other, including a plurality of (n×m) unit regions configured by a plurality of rows (n rows) and a plurality of columns (m columns), can be used as the light-shielding frame.

Alternatively, for example, a light-shielding frame having a plurality of (n×m) through holes, configured by a plurality of rows (n rows) and a plurality of columns (m columns), can be used, each through hole being regarded as a unit region of the light-shielding frame.

More specifically, a plurality of light-emitting devices can be produced as described below.

(1) One or more light-emitting elements are placed in each unit region in the light-emitting element placing step.

(2) The optical member is formed in each unit region in the optical member formation step.

(3) In the optical member bonding step, the optical member is bonded to collectively cover the one or more light-emitting elements placed in each unit region.

(4) In the second light-reflective member formation step, the second light-reflective resin is filled in the gap between the board and the light-shielding frame in each unit region.

After the second light-reflective member formation step, the light-reflective member and the board are divided into individual unit regions in a division step to singulate the light-emitting devices. This division can be performed by, for example, cutting with a blade or the like.

The positions to be divided into unit regions are preferably away from the outer perimeter of the light-shielding frame in consideration of the division into unit regions. In other words, the light-shielding frame preferably has its size smaller than that of the outer shape of the light-emitting device. In this case, for example, a plurality of light-shielding frames, each having a size slightly smaller than that of the outer shape of the corresponding light-emitting device, can be used for the light-shielding frame.

In accordance with the above manufacturing method for light-emitting devices, a plurality of light-emitting devices are collectively produced at once, followed by being divided into individual light-emitting devices, which can lead to a simple manufacturing of the light-emitting devices.

The effect of the recessed portion of the light-shielding frame will be described in detail. An embodiment of the present disclosure uses the light-shielding frame 5 having the flat portion 55 and the recessed portion 58 in the second main surface 5b as shown in FIG. 3 and FIG. 4. Such a light-shielding 5 contributes to the inhibited generation of voids in the manufacture of the light-emitting device. More specifically, the existence of the recessed portion 58 that is continuous with the through hole 50 in the light-shielding frame 5 can inhibit or prevent the generation of voids at a region of the first light-reflective member, the region being between the light-transmissive member and the light-shielding frame in the optical member.

The voids in the optical member are bubbles or the like formed of air confined in the light-reflective resin upon disposing the resin into the gap between the through hole of the light-shielding frame and the light-transmissive member. In the optical member formation step, the light-reflective resin is supplied on the light-shielding frame, and thereafter the light-transmissive member is disposed on the resin. Upon the disposition of the light-transmissive member, the supplied light-reflective resin on the light-shielding frame is pressed by the third surface of the light-transmissive member, which allows the supplied light-reflective resin to move into the gap between the light-transmissive member and the through hole of the light-shielding frame. With such movement of the light-reflective resin, the voids can be generated. One of the reasons for this void generation may be due to larger areas of the light-reflective resin being simultaneously in contact with the third surface of the light-transmissive member upon the disposition of the light-transmissive member. In particular, it is conceivable that such contact of the light-reflective resin over the larger areas makes the light-reflective resin move from the larger areas into the gap between the light-transmissive member and the through hole of the light-shielding frame—i.e., move simultaneously in the multiple directions—which can promote the air to be confined in the resin. When the light-reflective resin is cured with bubbles being present, such bubbles may remain as the voids in the first light-reflective member.

The generation of voids in the optical member is not desirable for the optical properties of the light-emitting device. For example, the voids may reduce the effect such as improvement of the light extraction efficiency provided by the first light-reflective member interposed between the light-transmissive member and the light-shielding frame. The manufacturing method according to an embodiment of the present disclosure reduces or prevents the generation of these voids in the optical member, and thereby making it possible to manufacture the light-emitting device having desired optical properties.

Also, the voids in the optical member may reduce the bonding strength between components. In the optical member, the first light-reflective member serves to bond the light-transmissive member and the light-shielding frame with each other by being interposed therebetween. If the first light-reflective member contains the voids therein, the bonding strength may be reduced. In the manufacturing method according to an embodiment of the present disclosure, such voids can be reduced or eliminated, so that the bonding strength between components of the optical member can be more suitably retained.

FIGS. 3 and 4 show an example of the light-shielding frame 5. The light-shielding frame 5 has the through hole 50 and the frame part 52. When viewed from above (i.e., in a top view), the light-shielding frame 5 has a substantially rectangular shape, and the through hole 50 is positioned inside of the frame part 52. To put it simply, the light-shielding frame 5 has such a form that a particular portion corresponding to the through hole 50 has been removed from a plate-like member. In the light-shielding frame 5 as shown in FIGS. 3 and 4, the light-shielding frame 5 may be shaped such that the substantially rectangular portion corresponding to the through hole 50 has been removed from a flat plate member having the substantially rectangular shape, for example.

The frame part 52 of the light-shielding frame 5 has the first main surface 5a and the second main surface 5b opposite to the first main surface 5a. The through hole 50 of the light-shielding frame 5 is an opening penetrating from the first main surface 5a to the second main surface 5b. In an embodiment of the present disclosure, the second main surface 5b of the frame part 52 is provided with the flat portion 55 and the recessed portion 58 that is continuous with the through hole 50.

The recessed portion 58 corresponds to a part by which the thickness of the light-shielding frame 5 (i.e., the distance between the first and second main surfaces) is partially reduced. Accordingly, the recessed portion is in a depressed or notched form in the light-shielding frame. In particular, the recessed portion 58 of the light-shielding frame 5 is provided in the second main surface 5b facing the third surface of the light-transmissive member 3.

In the manufacture of the light-emitting device, the light-reflective resin is supplied onto the second main surface 5b of the light-shielding frame 5. The second main surface 5b has the recessed portion 58 and the flat portion 55, and the light-reflective resin is supplied onto at least the flat portion 55 of the second main surface 5b.

The supplied light-reflective resin, which has been disposed on at least the flat portion, is allowed to move due to the pressure caused by the contact with the light-transmissive member 3 in the optical member formation step. Even if the voids are generated with this movement of the light-reflective resin, the recessed portion 58 of the light-shielding frame 5 serves to promote the voids to effectively escape from the light-reflective resin. That is, the recessed portion 58, which is continuous with the through hole 50 in the light-shielding frame 5, can serve to guide the voids generated in the gap between the through hole 50 and the light-transmissive member 3, toward the outside during the formation of the optical member.

Specifically, the light-transmissive member is brought into contact with and pressed against the light-reflective resin so as to dispose the light-reflective resin into the gap between the light-transmissive member and the light-shielding frame in the optical member formation step, in which case the voids are likely to be discharged to the outside via the recessed portion while the light-transmissive member is pressed. The recessed portion is thinner than the flat portion in the light-shielding frame, and thus a gap formed by the recessed portion of the light-shielding frame and the light-transmissive member facing each other is larger than that formed by the flat portion of the light-shielding frame and the light-transmissive member. Thus, the stress applied to the light-reflective resin due to the pressure at the recessed portion is small, which makes it easier for the light-reflective resin to move along the recessed portion. With such movement of the resin, the voids can also move relatively easily to the recessed portion, and thereby allowing the voids 80 which have moved to the recessed portion 58 to easily escape to the outside through the recessed portion 58, as shown in FIG. 6. As a result, the generation of voids can be inhibited in the optical member. In other words, the optical member is provided by curing the disposed light-reflective resin between the light-transmissive member and the through hole of the light-shielding frame, in which case the voids can be discharged to the outside prior to the curing. In this way, an embodiment of the present disclosure has the recessed portion of the light-shielding frame as a guide for facilitating the escape of the voids to the outside during the optical member formation step.

The recessed portion 58 of the light-shielding frame 5 has another effect that is different from the guide effect described above. In this regard, the recessed portion 58 of the light-shielding frame 5 has the effect of further reducing the generation of voids because of the locally small thicknesses of the frame.

The further inhibition of the generation of the voids by the recessed portion 58 of the light-shielding frame 5 will be described in detail. In the optical member formation step, the height of the supplied light-reflective resin over the light-shielding frame is locally different because of the presence of the recessed portion of the light-shielding frame on the assumption that the light-reflective resin is disposed on the recessed portion as well as the flat portion. That is, the disposed light-reflective resin over the light-shielding frame includes a relatively high portion and a relatively low portion in height with respect to the first main surface 5a, i.e., the lower surface of the light-shielding frame. Specifically, the height of the light-reflective resin on the recessed portion of the second main surface is preferably relatively low, which makes it possible for the height of the light-reflective resin on the non-recessed portion of the second main surface (i.e., the height of the light-reflective resin located on the flat portion) to be relatively high, which will be described below in detail. Accordingly, the light-transmissive member can be brought into contact with the light-reflective resin with a time lag because of the height difference of the light-reflective resin in the optical member formation step, which can lead to the inhibited generation of the voids in the resulting optical member.

FIGS. 7A and 7B schematically show the form of the light-reflective resin 9a' that has been supplied on the light-shielding frame 5 during the light-reflective resin supply step. In this step, an uppermost portion (or top portion) of the supplied light-reflective resin 9a' is positioned above the flat portion 55, as shown in FIGS. 7A and 7B. That is, it is preferred that the relation $H_1<H_2$ holds, where $H_1$ represents the height of a portion $9a_1'$ of the supplied light-reflective resin 9a' located directly on the recessed portion 58 of the light-shielding frame 5, and $H_2$ represents the height of a portion $9a_2'$ of the supplied light-reflective resin 9a' located on the flat portion 55 of the light-shielding frame 5. The heights $H_1$ and $H_2$ of the light-reflective resin as used herein mean the distances from the first main surface 5a of the light-shielding frame to the respective top points of the light-reflective resin.

The reason why the uppermost portion of the light-reflective resin is positioned above the flat portion is as follows. When the light-reflective resin 9a' in its uncured state is supplied on the light-shielding frame 5 having the recessed portion 58 and the flat portion 55, the light-reflective resin wet-spreads over the light-shielding frame and stays on the second main surface thereof due to its surface tension. Because the recessed portion 58 has its surface that is lower in height from the first main surface than that of the flat portion 55, the light-reflective resin staying on the second main surface is relatively low in height in the recessed portion 58, which leads to the higher portion of the light-reflective resin located on the flat portion 55. In this way, the supplied light-reflective resin has the uppermost portion at the position of the flat portion 55 of the light-shielding frame.

When the light-reflective resin has its locally different heights due to the recessed portion, the voids are unlikely to be generated during the optical member formation step. In the optical member formation step, the light-reflective resin that has been disposed on the light-shielding frame is allowed to move into the gap between the light-transmissive member and the through hole of the light-shielding frame by the pressure caused due to the contact with the light-transmissive member. The light-transmissive member, which contacts the light-reflective resin on the light-shielding frame, acts to press the light-reflective resin. Supposing that the height of the supplied light-reflective resin over the light-shielding frame is uniform, larger areas of the third surface of the light-transmissive member and the light-reflective resin are likely to be brought into simultaneous contact with each other during the pressing of the light-reflective resin by the light-transmissive member. This simultaneous contact over the larger areas between the light-reflective resin and the light-transmissive member results in a movement of the light-reflective resin from larger areas of the second main surface into the gap between the light-transmissive member and the through hole of the light-shielding frame. Such movement of the light-reflective resin from the larger areas into the gap between the light-transmissive member and the through hole of the light-shielding frame may easily keep air caught or inserted into the light-reflective resin, so that the voids are likely to be generated in the optical member. On the other hand, in a case in which the height of the supplied light-reflective resin 9a' over the light-shielding frame 5 is locally different according to the manufacturing method of an embodiment of the present disclosure as shown in FIG. 7, the flange of the light-transmissive member can contact with the light-reflective resin with a time lag. Accordingly, when the light-reflective resin moves to the gap between the light-transmissive member and the through hole of the light-shielding frame, the air therebetween is likely to escape to the outside. That is, the optical member can be provided by curing the light-reflective resin disposed in the gap between the light-transmissive member and the through hole of the light-shielding frame, while the generation of voids can be inhibited prior to the curing. In this way, the recessed portion of the light-shielding frame in an embodiment of the present disclosure has the effect of ensuring that a suitable movement of the light-reflective resin is performed while inhibiting the generation of voids in the optical member formation step.

The contact between the light-transmissive member and the light-reflective resin with the time lag is described in detail referring to the schematic diagrams of FIGS. 12A to 12D. FIGS. 12A to 12D show changes over time in the optical member formation step. The left drawings schematically show changes of the uppermost portions of the light-reflective resin over time, and the right drawings schematically show changes of the non-uppermost portions of the light-reflective resin over time. That is, the right drawings schematically show relations between the light-reflective resin 9a' located on the recessed portion 58 and the flange 30 of the light-transmissive member 3 over time, and the left drawings schematically show relations between the light-reflective resin 9a' located on the flat portion 55 and the flange 30 of the light-transmissive member 3 over time. As shown in such drawings, the optical member formation step is performed such that the light-reflective resin 9a' contacts the third surface 3e of the light-transmissive member 3 with the time lag because of the height difference of the light-reflective resin 9a'.

Figure 12A:
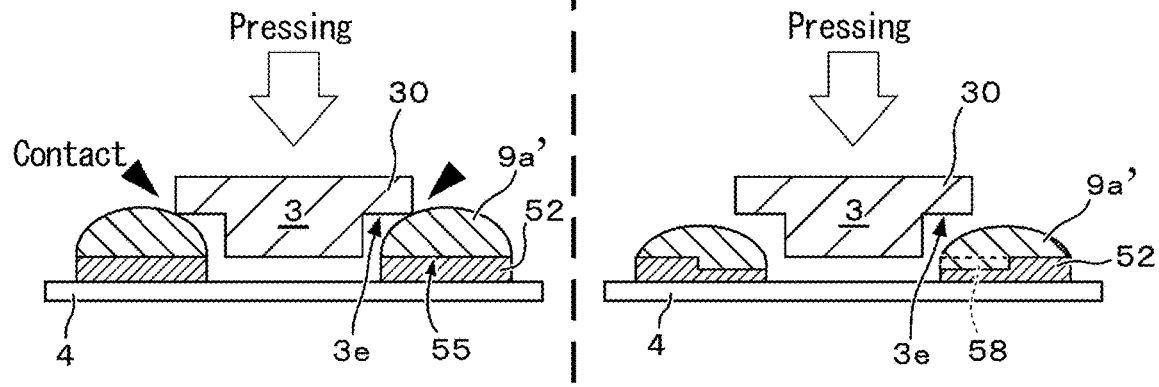
FIG. 12A is a schematic sectional view for explaining an example of the manufacturing method according to an embodiment.
Figure 12B:
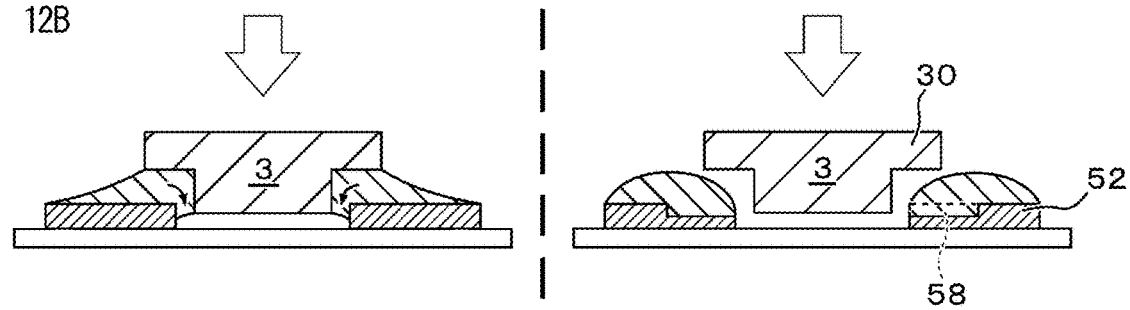
FIG. 12B is a schematic sectional view for explaining the example of the manufacturing method according to the embodiment.
Figure 12C:
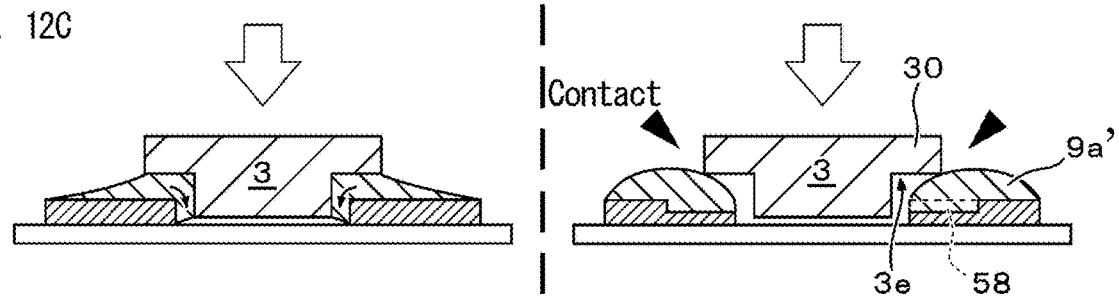
FIG. 12C is a schematic sectional view for explaining the example of the manufacturing method according to the embodiment.
Figure 12D:
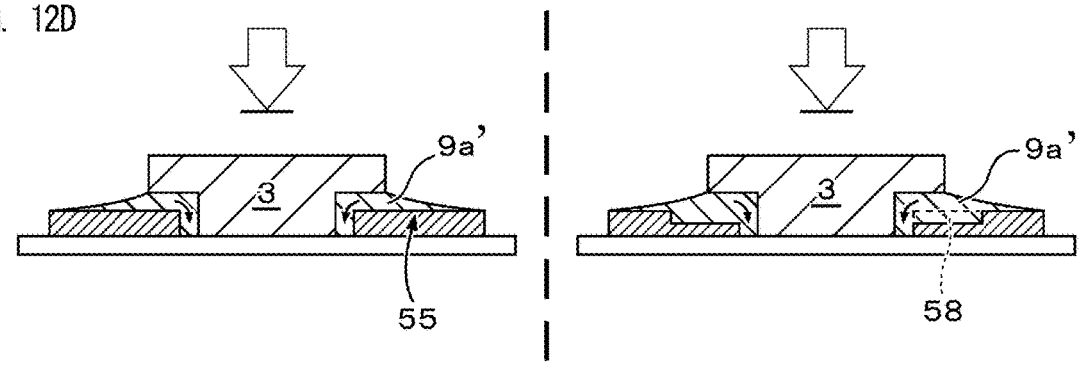
FIG. 12D is a schematic sectional view for explaining the example of the manufacturing method according to the embodiment.

When the light-transmissive member 3 is disposed in the through hole, the third surface 3e of the light-transmissive member 3 first makes contact with the light-reflective resin 9a' located on the flat portion 55, as shown in the left drawings in FIG. 12A. Subsequently, as the light-transmissive member 3 is forced to move down, the third surface 3e of the light-transmissive member 3 is brought into contact with the light-reflective resin 9a' located on the recessed portion 58, as shown in the right drawings in FIG. 12C. In this way, the contact between the light-transmissive member 3 and the light-reflective resin 9a' located on the light-shielding frame 5 involves the time lag due to the height difference of such light-reflective resin 9a'.

The supply of the light-reflective resin in the light-reflective resin supply step is preferably performed such that the light-reflective resin is supplied not only on the flat portion, but also on the recessed portion (i.e., the frame region other than the flat portion of the light-shielding frame). Particularly as for the flat portion 55, the light-reflective resin 9a' is preferably supplied such that a region for the wet-spread of the resin is not left so much in the light-shielding frame 5. When the supplied light-reflective resin 9a' wet-spreads excessively over the flat portion 55, the height of the light-reflective resin 9a' located on the flat portion 55 becomes relatively lower, thus resulting in a smaller difference in the height of the light-reflective resin 9a' between the recessed portion 58 and the flat portion 55. In this view, the light-reflective resin 9a' is preferably supplied onto the flat portion 55 such that the region for the wet-spread of the resin is not substantially left so much. For example, the light-reflective resin 9a' may be applied such that it covers substantially the entire frame width of the flat portion 55.

In the light-shielding frame 5, the frame part 52 is, for example, in a form of a quadrangle as a whole that has therein a substantially rectangular through hole 50 in a top view. That is, the frame part 52 has a quadrangular shape in a top view. The term "quadrangular shape" as used herein refers to a substantially quadrangular shape and should be broadly interpreted so as to imply squares, rectangles, parallelograms, and trapezoids. In a certain embodiment, the shape of the frame part 52 in a top view has a substantially rectangular or oblong shape. That is, as shown in FIG. 4, the light-shielding frame is shaped to be substantially rectangular in a top view. The term "substantially rectangular" as used herein is not limited to a perfect rectangle, but also encompasses shapes that are usually regarded as "approximately" rectangular by those skilled in the art while being modified from the perfect rectangle. For example, such term includes not only rectangles with all straight sides, but also rectangles that contain a curved line on at least a part of the sides, and also rectangles with an R-shaped corner.

In an embodiment of the present disclosure, the recessed portion 58 may be provided in an area of the frame part 52, the area corresponding to at least one of the sides of the rectangle of the light-shielding frame having the through hole of the substantially rectangular shape in a top view. For example, only one recessed portion 58 may be provided for an area of the frame part 52, the area corresponding to one side of such rectangle thereof. In other words, the number of the recessed portion 58 provided for the frame part 52's area corresponding to the one side of such rectangle may be one, not two or more. Even in this case, the generation of voids can be inhibited upon the filling of the light-reflective resin into the gap between the light-transmissive member and the through hole of the light-shielding frame in the optical member formation step.

In a certain embodiment, the recessed portion may be located at least at the longer side of the rectangle of the light-shielding frame having the through hole of the substantially rectangular shape in a top view. The voids are likely to be generated in such particular portion corresponding to the longer side of the rectangular light-shielding frame. This is because, especially in the portion corresponding to the longer side of the through hole, the light-transmissive member and the light-reflective resin are made contact with each other with a long distance upon the disposition of the light-transmissive member, which means that this portion can be one where air is difficult to escape to the outside upon the movement of the light-reflective resin into the gap between the light-transmissive member and the through hole of the light-shielding frame. In this regard, the light-shielding frame employed in the light-emitting device of an embodiment of the present disclosure has the recessed portion that is located at the "longer side" where the air is difficult to escape, so that the generation of voids can be inhibited more effectively. In other words, the inhibiting effect of the void generation tends to become more remarkable in a case in which the recessed portion is located in the portion corresponding to the longer side of the light-shielding frame.

Figure 13A:
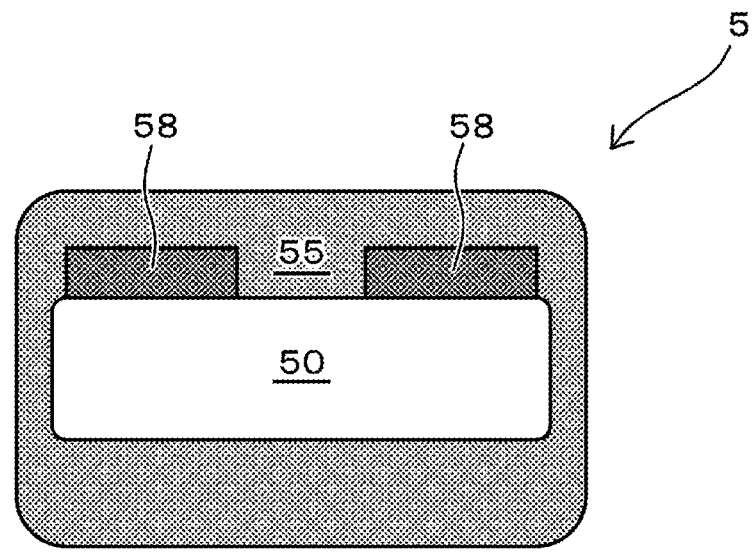
FIG. 13A is a schematic top view showing an example of a light-shielding frame of a light-emitting device according to an embodiment.
Figure 13B:
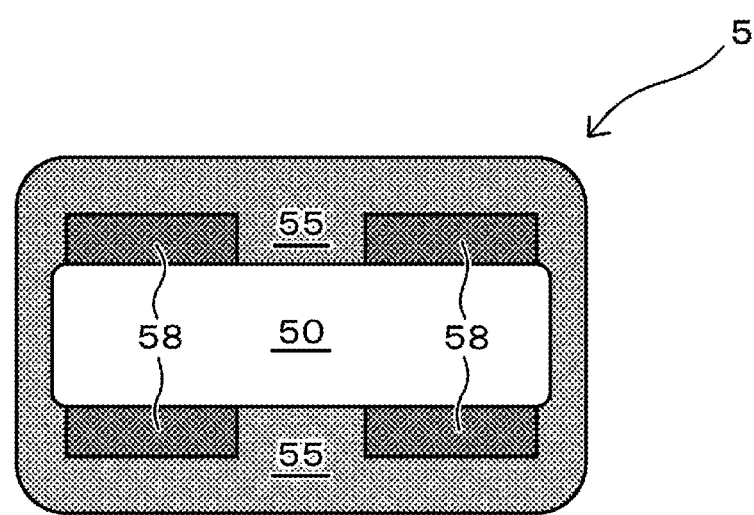
FIG. 13B is a schematic top view showing an example of a light-shielding frame of a light-emitting device according to an embodiment.

In a case in which the light-shielding frame has the rectangular through hole, the recessed portions may be located to sandwich the flat portion therebetween in the longer side of the rectangle. For example, as shown in FIGS. 13A and 13B, the flat portion 55 may be at least in position between two recessed portions 58 in a frame part of the light-shielding frame, the frame part corresponding to the longer side of the substantially rectangular shape of the light-shielding frame. This makes it easier for the light-reflective resin on the flat portion to have the uppermost portion, which allows the light-transmissive material to be brought into a gradual contact with the light-reflective resin, starting from the light-reflective resin on the flat portion when the contact is made between the light-transmissive member and the light-reflective resin in the optical member formation step. That is, during the movement of the light-reflective resin into the gap between the light-transmissive member and the through hole of the light-shielding frame, the air therebetween is likely to escape from the flat portion toward the recessed portions. Accordingly, the optical member can be formed while preventing the generation of voids more effectively.

It is preferred that the two recessed portions with the flat portion sandwiched therebetween are located at both ends of the longer side in which the recessed portions are provided. That is, as shown in FIGS. 13A and 13B, it is preferred that the flat portion 55 is located at the center of a frame part corresponding to one longer side of the rectangle of the light-shielding frame 5 in a top view (for example, at a particular region where the one longer side can be divided substantially equally into the two), while the recessed portions 58 are located at both side regions of the flat portion as if the recessed portions 58 sandwich the flat portion. When the flat portion is provided at the central region of the light-shielding frame in this way, the light-reflective resin can have its uppermost portion at the central region. Thus, the light-transmissive member can make the gradual contact with the light-reflective resin from the central region toward the both side regions sandwiching the central region when the contact is made between the light-transmissive member and the light-reflective resin in the optical member formation step. This means that the air is likely to escape in opposite directions from the center with less unevenness, thereby making it possible to more effectively inhibit the generation of voids in the formation of the optical member.

The contour of the recessed portion 58 can be constituted by a straight line, a curved line, or a combination of these lines in a top view. For example, the recessed portion 58 can have a substantially quadrangular shape in a top view. The expression "substantially quadrangular shape" as used herein is broadly interpreted so as to imply not only a perfectly quadrangular shape, but also shapes that can be regarded by those skilled in the art as shapes derived from the perfectly quadrangular shape. Accordingly, for example, the expression "substantially quadrangular shape" regarding the recessed portion not only implies rectangles, parallelograms, trapezoids, and the like, but also implies that the angled portion of such shape does not necessarily have to be sharp but may be rounded (in short, the corners of the contour of the recessed portion may be rounded off).

The recessed portion corresponds to a thinner portion of the light-shielding frame. The thickness of the recessed portion is less than or equal to half the thickness of the flat portion. Specifically, when "t" is the thickness of the light-shielding frame 5 at the recessed portion 58, and "T" is the thickness of the light-shielding frame at the flat portion 55, the following formula may be satisfied: $0.1T \leq t \leq 0.5T$, for example. If the thickness "t" at the recessed portion is less than 0.1T, it can be hard to provide the desired strength of the light-shielding frame. On the other hand, if the thickness "t" is greater than 0.5T, it can be hard to provide the effect of the recessed portion as a bubble guide described above or the effect of making the light-reflective resin relatively higher at the flat portion. The thickness "t" as used herein refers to the greatest value in the thickness of the light-shielding frame at the recessed portion. Similarly, the thickness "T" as used herein refers to the greatest thickness value among the thicknesses of the frame part corresponding to "one side" of the light-shielding frame.

In an embodiment of the present disclosure, it is preferred that the recessed portion is spaced from the outer periphery of the light-shielding frame. This can inhibit the light-reflective resin from wet-spreading from the second main surface of the light-shielding frame to the outside of the outer periphery of the light-shielding frame via the recessed portion 58 in the supply of the light-reflective resin onto the recessed portion 58 or in the subsequent optical member formation step. As shown in FIG. 4, the distance $D_1$ between the outer periphery 53 of the light-shielding frame and the outer side 58a of the recessed portion 58 in the width direction of the light-shielding frame may be, for example, 10% or more and 80% or less of the width "W" of the light-shielding frame (especially in a case of the width "W" of the frame part having the recessed portion), and may be 30% or more and 60% or less of such width as an example.

Figure 15:
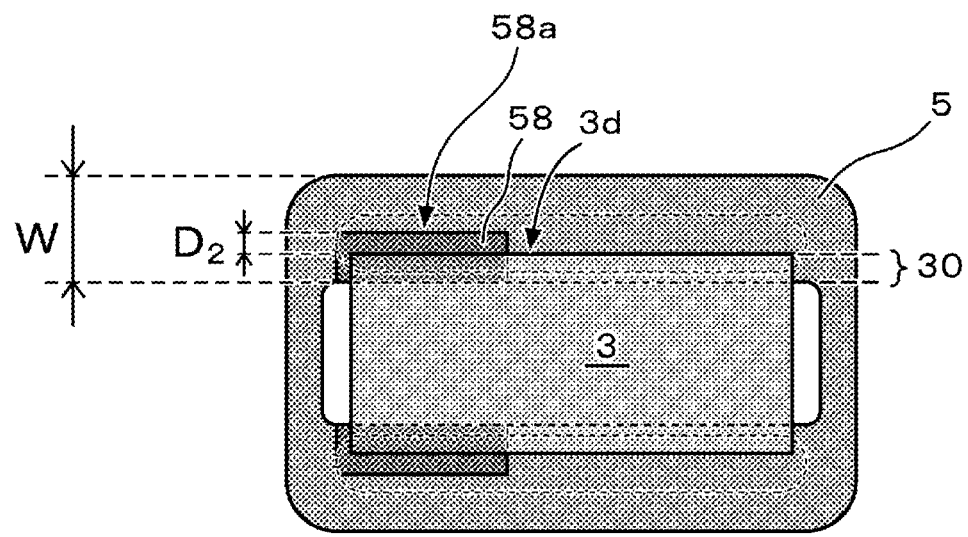
FIG. 15 is a schematic top view showing an example of a light-transmissive member and a light-shielding frame of a light-emitting device according to an embodiment.

FIG. 15 is a schematic sectional view showing an example of the light-shielding frame of the light-emitting device of the present embodiment.

The recessed portion 58 according to the present embodiment extends outward beyond the second lateral surface 3d of the light-transmissive member 3. That is, the recessed portion 58 extends up to the point that is outside of the flange 30 of the light-transmissive member 3 in the optical member formation step.

The recessed portion extending outward beyond the second lateral surface makes it easier for the voids to move toward the second lateral surface of the light-transmissive member via the recessed portion and thus to be discharged more to the outside in the optical member formation step. In other words, the recessed portion can more suitably serve as a guide for escaping the voids. As shown in FIG. 15, the outer side 58a of the recessed portion 58 is positioned outside of the second lateral surface 3d of the light-transmissive member 3 in the width direction of the light-shielding frame in a top view. The distance $D_2$ between the side 58a and the second lateral surface 3d may be, for example, 5% or more and 50% or less of the width "W" of the light-shielding frame (especially in a case of the width "W" of the frame part having the recessed portion), and may be 10% or more and 40% or less of the width "W" as an example.

The method of manufacturing a light-emitting device according to an embodiment of the present disclosure can be variously embodied.

Recessed Portion in Inclined Form

Figure 14:
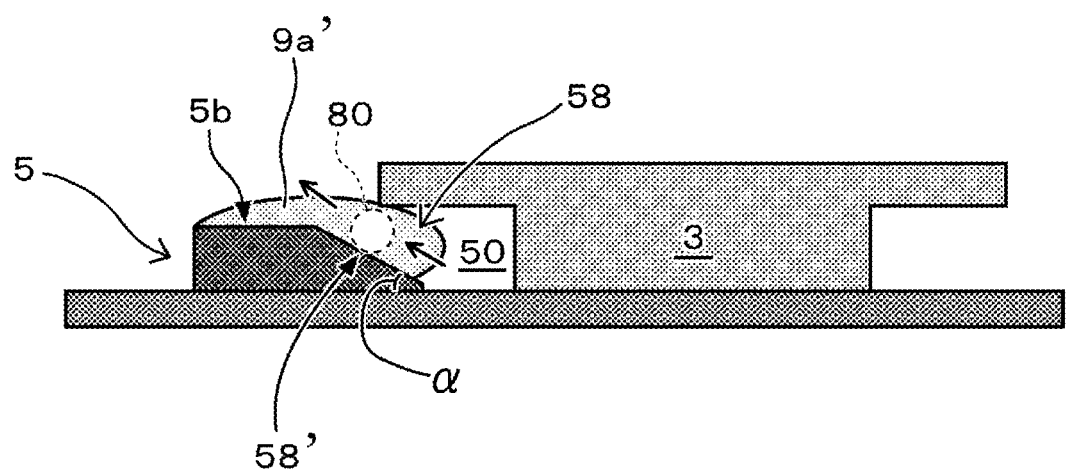
FIG. 14 is a schematic sectional view showing an example of a manufacturing method according to an embodiment.

In this embodiment of the present disclosure, the recessed portion may have an inclined form. For example, as shown in FIG. 14, a bottom surface 58' of the recessed portion 58 is inclined with respect to the second main surface 5b in the light-shielding frame 5.

Preferably, the bottom surface 58' of the recessed portion is inclined to gradually increase in the frame thickness from the through hole side in the width direction of the light-shielding frame. This makes it easier for the voids 80 to be guided to the recessed portion to be discharged to the outside (see FIG. 14). In other words, the recessed portion in the inclined form can improve its effectiveness as the guide for guiding, to the outside, the voids generated in the optical member formation step. The recessed portion in the inclined form makes it easier for the voids generated near the inner perimeter of the through hole to move along the inclined surface of the recessed portion to escape to the outside through the recessed portion.

The inclination angle of the bottom surface of the recessed portion may be 20° or more and 70° or less, for example 30° or more and 60° or less. In other words, as for the inclination angle "a" shown in FIG. 14, $20° \leq \alpha \leq 70°$, for example $30° \leq \alpha \leq 60°$ may be satisfied. When the inclination angle "α" is between 20° and 70°, the generated voids are likely to flow into the recessed portion with less resistance, and also the voids having flowed into the recessed portion can be more easily guided to the outside.

Additional Provision of Narrow Portion

Figure 16:
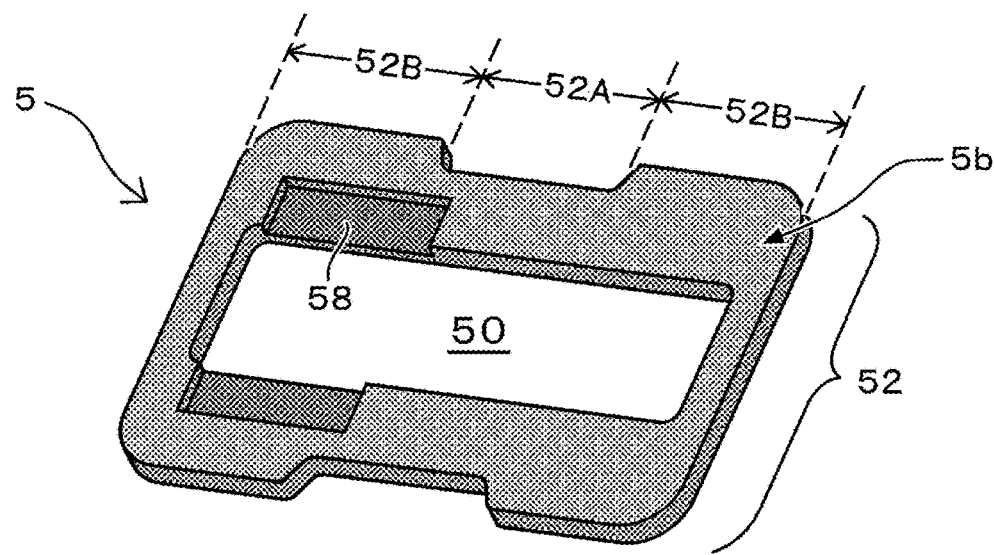
FIG. 16 is a schematic perspective view showing an example of a light-shielding frame of a light-emitting device according to an embodiment.
Figure 17:
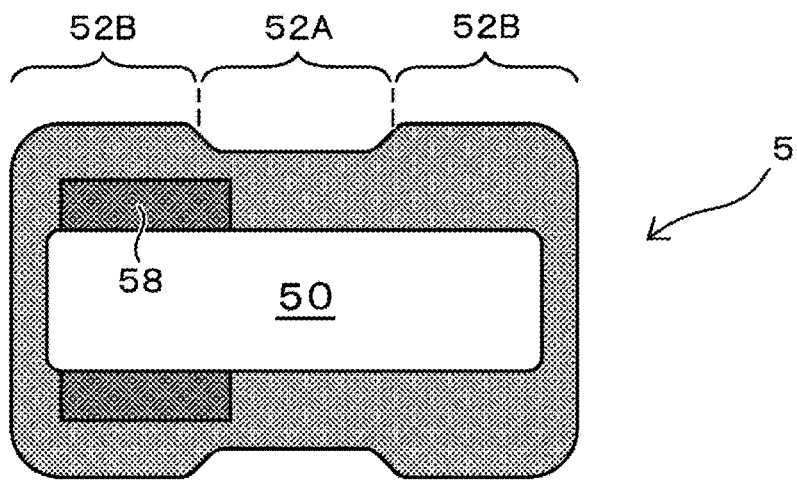
FIG. 17 is a schematic top view showing an example of a light-shielding frame of a light-emitting device according to an embodiment.

In this embodiment of the present disclosure, the light-shielding frame has a narrow portion in addition to the recessed portion. Specifically, as shown in FIGS. 16 and 17, the light-shielding frame 5 has a substantially rectangular shape in a top view, and it has a narrow region 52A that is partially narrow at the longer side of the rectangle, and a wide region 52B that is wider than the narrow region 52A. The recessed portion 58 may be provided at least in the wide region 52B of the light-shielding frame.

The light-shielding frame 5 with the narrow and wide regions 52A and 52B has such a form that the width of the frame part 52 is not constant but locally narrowed. That is, with such narrow region 52A, the frame part 52 of the light-shielding frame 5 has a partially narrowed form in a top view.

Particularly in the light-shielding frame 5 having such narrow and wide regions 52A and 52B, the height of the light-reflective resin supplied in the light-reflective resin supply step is more likely to be locally different. When the light-reflective resin in its uncured state is supplied to the light-shielding frame having the narrow and wide regions, the light-reflective resin wet-spreads on the light-shielding frame. In this regard, the light-reflective resin tends to spread more in the wide region because of a relatively large area of the region, while the light-reflective resin tends to spread less in the narrow region because of a relatively small area of the region. Therefore, the height of the light-reflective resin becomes relatively low at the wide region due to the relatively wide area, while the height of the light-reflective resin becomes relatively high at the narrow region.

Figure 18A:
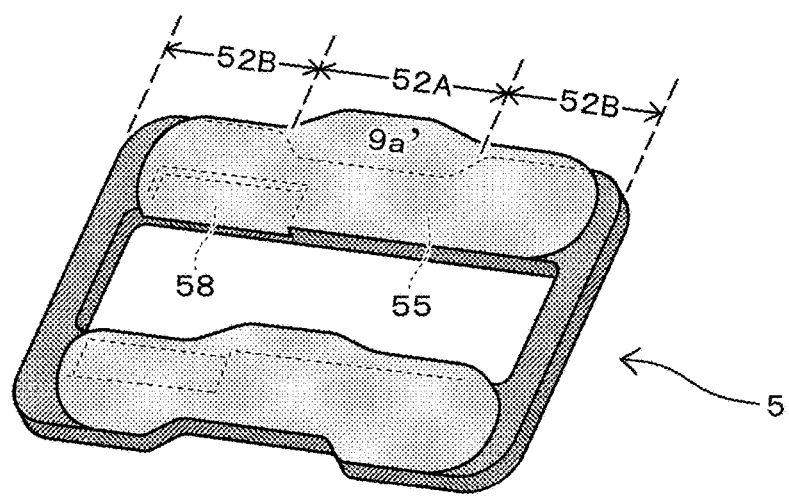
FIG. 18A is a schematic perspective view for explaining an example of a manufacturing method according to an embodiment.
Figure 18B:
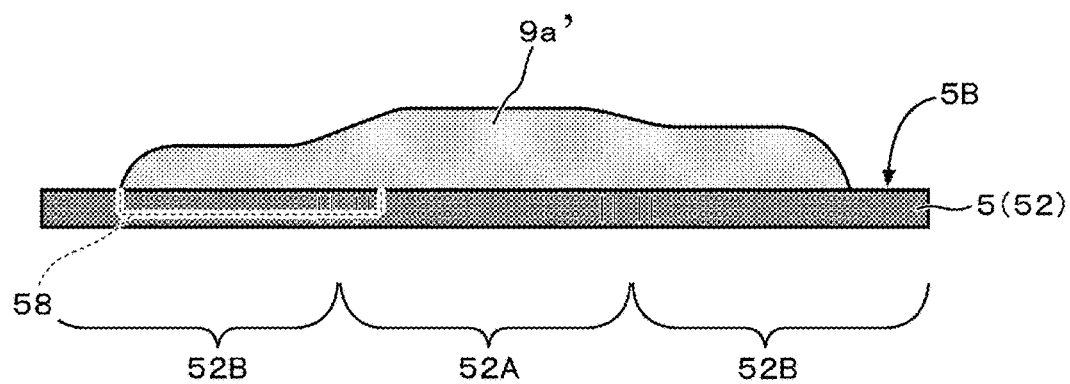
FIG. 18B is a schematic side view for explaining the example of the manufacturing method according to the embodiment.

FIGS. 18A and 18B are schematic views showing a state in which the height of the light-reflective resin is locally different over the light-shielding frame 5 having the narrow region 52A and the wide region 52B. In this embodiment, the local difference in the height of the supplied light-reflective resin 9a' becomes more remarkable due to the synergistic effect of having not only the recessed portion 58 but also the narrow and wide regions 52A and 52B. In other words, the optical member formation step is performed such that the time lag of contact is more likely to be given upon the contact being made between the flange of the light-transmissive member and the light-reflective resin, and thereby facilitating the escape of the voids to the outside.

It is preferred that such recessed portion and narrow and wide regions are provided at least in the longer side portion of the light-shielding frame. In this case, at least a part of the recessed portion is preferably located at the wide region. In other words, it is preferred that the longer side portion of the light-shielding frame has the wide region and the narrow region which is narrower than the wide region in a top view, and that at least a part of the recessed portion is located at the wide region of the longer side. This can give a synergistic effect of not only creating a difference in the height of the light-reflective resin due to the recessed portion, but also creating a difference in the height of the light-reflective resin due to the narrow and wide regions, in the longer side portions of the light-shielding frame where the voids are more likely to be generated.

For example, as shown in FIGS. 16 and 17, the recessed portion 58 may be provided in the wide regions 52B between which the narrow region 52A is located. In this case, the light-reflective resin 9a' tends to easily have its uppermost portion at the narrow region 52A. Therefore, the optical member formation step can be performed such that the contact between the flange 30 of the light-transmissive member 3 (especially the third surface of the light-transmissive member 3) and the light-reflective resin 9a' involves the time lag due to the uppermost portion located above the narrow region, and thereby allowing the voids to escape to the outside.

Figure 19:
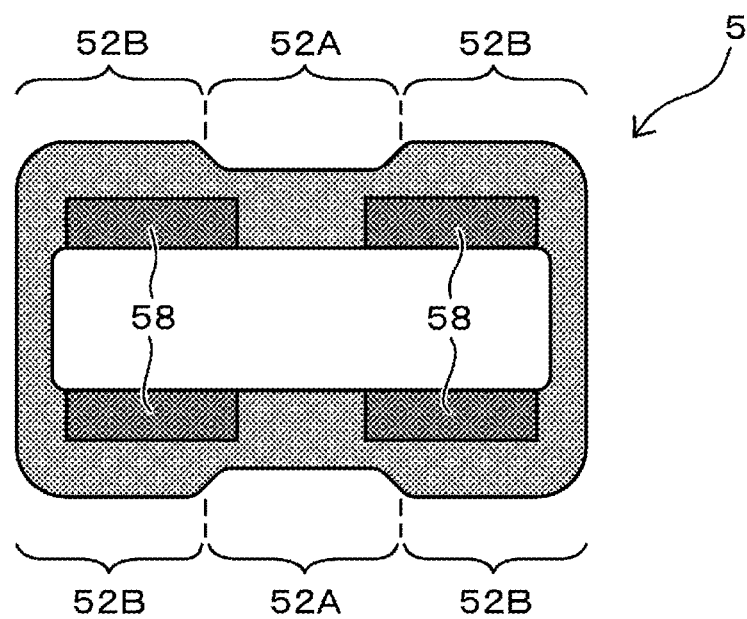
FIG. 19 is a schematic top view showing an example of a light-shielding frame of a light-emitting device according to an embodiment.

In a certain embodiment, the narrow regions 52A may be located at opposite positions of frame part in the light-shielding frame 5, and the recessed portion 58 may be provided in each of the wide regions 52B between which the narrow region 52A is sandwiched in each of such frame positions (see FIG. 19). In other words, in a case in which the light-shielding frame has, for example, a quadrangular frame shape in a top view, a combination of the narrow and wide regions and the recessed portions may be provided in pairs at frame parts corresponding to the opposite sides of the quadrangular shape. For example, in a case in which the light-shielding frame has a substantially rectangular shape in a top view, a combination of the narrow and wide regions and the recessed portions may be provided in pairs at the frame parts corresponding to the opposite longer sides of the rectangular shape. This makes it possible to more effectively provide the effect of preventing the generation of voids at the "longer side" where air is generally difficult to escape during the optical member formation step.

The narrow region has such a form that the outer periphery of the light-shielding frame has been depressed or cut out in a top view. In other words, the narrow region can be a region where the outer periphery of the frame part 52 is in a partially inwardly depressed form in the frame width dimension, as shown in FIGS. 16 and 17.

Such narrow region of the light-shielding frame makes it possible for the second light-reflective member formation step to be performed such that the second light-reflective resin 9b' can be supplied from the outside of the narrow region into the gap between the board 10 and the light-shielding frame 5. This can suitably ensure a space for disposing a nozzle for supplying the resin so that multiple light-shielding frames can be located close to each other in a manufacturing process, which can lead to an increase in the number of the light-emitting devices to be handled.

Embodiments of the present disclosure have been described above, but the embodiments are merely examples. Accordingly, those skilled in the art will easily understand that the present invention is not limited to the above embodiments, but rather can be embodied in various other configurations.

For example, as for the light-reflective resin supply step described above, the light-reflective resin does not necessarily have to be supplied on all the sides of the light-shielding frame in the present disclosure. In a case in which the light-shielding frame has, for example, a substantially rectangular shape in a top view (i.e., in a case in which the frame part 52 has a rectangular shape in a top view), the light-reflective resin may be supplied only on an area of the frame part 52, the area corresponding to the longer side of the rectangular shape. In this case, the light-reflective resin on the "longer side" is allowed to flow toward the "shorter side" when the light-reflective resin is supplied on the light-shielding frame and/or when the light-reflective resin on the light-shielding frame is pressed by the flange of the light-transmissive member such that the light-reflective resin flows into the gap between the light-transmissive member and the through hole of the light-shielding frame. That is, the light-reflective resin on the longer side of the frame part can flow toward the "shorter side" of the frame part upon being filled into the gap between the light-transmissive member and the through hole of the light-shielding frame.

Figure 20:
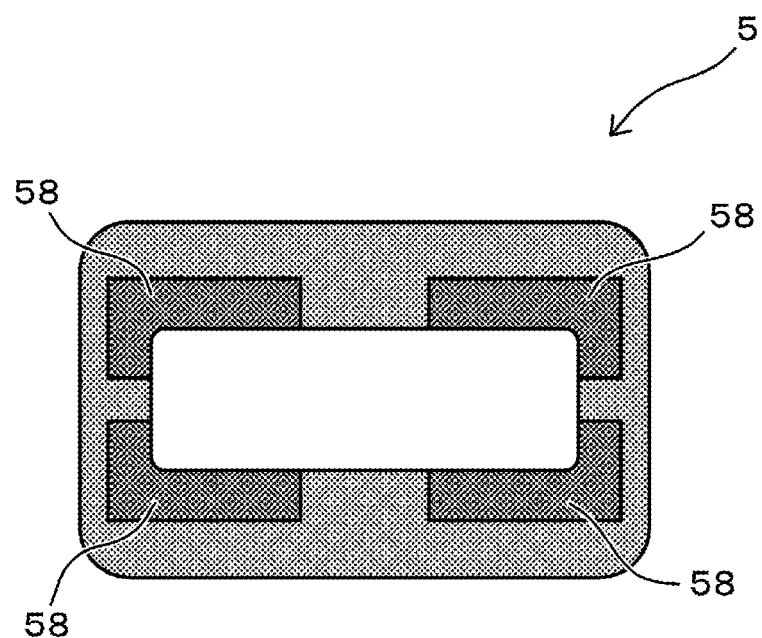
FIG. 20 is a schematic top view showing an example of a light-shielding frame of a light-emitting device according to an embodiment.

In a case in which the light-shielding frame has a substantially rectangular shape in a top view, a description has been given mainly on an example in which the recessed portion is located in an area of the frame part, the area corresponding to the longer side of the rectangular shape. However, the present invention is not limited to such example. For example, in addition to or instead of such longer side, the recessed portion may be located in an area of the frame part, the area corresponding to the shorter side of the light-shielding frame. In this regard, as shown in FIG. 20, the recessed portion 58 may be provided such that it extends continuously to cover both the longer and shorter sides of the light-shielding frame 5, for example.

The method of manufacturing a light-emitting device according to the present disclosure can be suitably used for producing light-emitting devices to be employed for vehicles, lightings and/or the like.

The invention claimed is:

1. A method of manufacturing a light-emitting device, the method comprising:
  placing a light-emitting element on a board;
  providing a light-shielding frame, the light-shielding frame having a first main surface and a second main surface opposite to the first main surface, the light-shielding frame defining a through hole penetrating from the first main surface to the second main surface, the second main surface having a flat portion and at least a first recessed portion that is continuous with the through hole;

supplying a light-reflective resin on at least the flat portion of the second main surface of the light-shielding frame;

providing a light-transmissive member, the light-transmissive member having a first surface having an outer perimeter that is smaller than an inner perimeter of the through hole, a second surface opposite to the first surface, a first lateral surface that is continuous with the first surface, a second lateral surface that is located outside of the first lateral surface and is continuous with the second surface, and a third surface that is continuous with the first lateral surface and second lateral surface;

forming an optical member, which comprises disposing the light-reflective resin between the first lateral surface of the light-transmissive member and an inner lateral surface defining the through hole and within the first recessed portion by bringing the third surface into contact with the light-reflective resin at a position where the first lateral surface of the light-transmissive member is spaced from the inner lateral surface defining the through hole, and thereafter, forming a first light-reflective member by curing the light-reflective resin to bond the light-shielding frame and the light-transmissive member with each other via the first light-reflective member; and bonding an upper surface of the light-emitting element and the second surface with each other.

2. The method of manufacturing a light-emitting device according to claim 1, wherein, in the step of supplying the light-reflective resin, the light-reflective resin is disposed on the first recessed portion as well as the flat portion.

3. The method of manufacturing a light-emitting device according to claim 2, wherein, in the step of supplying the light-reflective resin, an uppermost portion of the supplied light-reflective resin is positioned above the flat portion.

4. The method of manufacturing a light-emitting device according to claim 2, wherein, in the step of forming the optical member, the light-reflective resin contacts the third surface of the light-transmissive member with a time lag because of a height of the light-reflective resin.

5. The method of manufacturing a light-emitting device according to claim 1, wherein a bottom surface of the first recessed portion is inclined with respect to the second main surface in the light-shielding frame.

6. The method of manufacturing a light-emitting device according to claim 1, wherein the first recessed portion is spaced from an outer periphery of the light-shielding frame.

7. The method of manufacturing a light-emitting device according to claim 1, wherein:

the light-shielding frame has a substantially rectangular shape in a top view;

the second main surface has a second recessed portion that is continuous with the through hole; and the flat portion is at least in a position between the first and second recessed portions in a frame part of the light-shielding frame, the frame part corresponding to one side of the substantially rectangular shape.

8. The method of manufacturing a light-emitting device according to claim 1, wherein:

the light-shielding frame has a substantially rectangular shape in a top view; and the recessed portion is located at a longer side of the light-shielding frame.

9. The method of manufacturing a light-emitting device according to claim 8, wherein:

in a top view, the longer side of the light-shielding frame has a wide region and a narrow region that is narrower than the wide region; and at least a part of the recessed portion is located at the wide region of the longer side.

10. The method of manufacturing a light-emitting device according to claim 1, wherein the recessed portion has a rectangular shape in a top view.

11. The method of manufacturing a light-emitting device according to claim 1, wherein, in the step of forming the optical member, the recessed portion extends outward beyond the second lateral surface of the light-transmissive member.

* * * * *